United States Patent
Gauland et al.

(10) Patent No.: US 6,571,185 B1
(45) Date of Patent: May 27, 2003

(54) CONTINUALLY RESPONSIVE AND ANTICIPATING AUTOMATIC SETUP FUNCTION FOR A DIGITAL OSCILLOSCOPE

(75) Inventors: Michael A. Gauland, Hillsboro, OR (US); Steven K. Sullivan, Beaverton, OR (US); Roy I. Siegel, Portland, OR (US); Frederick A. Azinger, Portland, OR (US); Charles L. Saxe, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/295,070

(22) Filed: Apr. 20, 1999

(51) Int. Cl.$^7$ ........................... G01R 13/02; G06F 19/00
(52) U.S. Cl. ........................ 702/68; 345/440.1
(58) Field of Search ............... 702/68, 67, 120, 702/180, 79; 345/134, 440.1, 661; 324/115, 121 R; 356/450

(56) References Cited

U.S. PATENT DOCUMENTS

| | | | |
|---|---|---|---|
| 4,362,394 A | | 12/1982 | Menlove |
| 4,743,844 A | | 5/1988 | Odenheimer et al. |
| 4,766,425 A | * | 8/1988 | Tallman et al. ............. 340/712 |
| 4,779,044 A | | 10/1988 | Skolnick et al. |
| 5,003,248 A | * | 3/1991 | Johnson ................... 324/121 R |
| 5,039,937 A | * | 8/1991 | Mandt et al. ............ 324/121 R |
| 5,081,592 A | * | 1/1992 | Jenq ............................ 702/68 |
| 5,138,252 A | | 8/1992 | Ferguson |
| 5,495,168 A | | 2/1996 | De Vries |
| 6,219,142 B1 | * | 4/2001 | Kane ........................... 356/450 |
| 6,229,536 B1 | * | 5/2001 | Alexander et al. .......... 345/340 |
| 6,246,408 B1 | * | 6/2001 | Alexander ................... 345/348 |

* cited by examiner

Primary Examiner—John Barlow
Assistant Examiner—Demetrius Pretlow
(74) Attorney, Agent, or Firm—Boulden G. Griffith; Thomas F. Lenihan; Francis I. Gray

(57) ABSTRACT

Multiple views of the signal are generated by a time-sharing use of the oscilloscope's acquisition hardware. The instrument software makes a set of measurements of the input signal, and from the results of those measurements classifies the input signal as to type. Signals of particular types implicitly select suites of views of the signal. The operator sees examples of the other views available while a related view is the main view. Alternate views can be "live" miniature views, and displayed alongside in simplified form, alongside the main view. By clicking on them, these alternative views may be made to become the main view. The operator can add and modify views. Each view comes with a set of measurements that are automatically performed and the results are displayed on the screen as text annotation to the waveform. A different view of the signal comes with different automatic measurements, and presents the results of these measurements as annotations to the waveform image. These next alternative setups may be miniature "live" displays.

10 Claims, 15 Drawing Sheets

CONTINUALLY RESPONSIVE AND ANTICIPATING AUTOMATIC SETUP FUNCTION FOR A DIGITAL OSCILLOSCOPE

FIELD OF THE INVENTION

This invention relates to automatic setup of an oscilloscope or similar instrument, and more particularly to such a setup function that is continually responsive to the type of input signal and which provides user choices that anticipate the user's needs based on characteristics of the input signal. Multiple signal views are associated into a set of signal views, each member of said set being operatively connected for easy access for other members of the set.

CROSS-REFERENCE TO RELATED APPLICATIONS

[not applicable]

STATEMENT REGARDING FEDERALLY SPONSORED RESEARCH AND DEVELOPMENT

[not applicable]

BACKGROUND OF THE INVENTION

Prior art oscilloscopes with automatic setup functions were sometimes limited in usefulness by the difficulty of getting from one appropriate view to another. A new paradigm of oscilloscope operator interface control is needed, a paradigm that provides instant connectivity and transport between different signal views within a set of related views.

Oscilloscopes have for some time been able to automatically determine vertical gain, vertical position, trigger level and horizontal time scale settings in response to simple signal inputs, such as a sine wave or square wave. However, the effectiveness of these automatic settings was sometimes compromised by the need to make assumptions about the nature of the input signal.

Oscilloscopes typically power-up to a "factory" or "power-up" setup. Doing so serves several functions. This will typically be a frequently used setup, and therefore has some chance of being at or close to a suitable setup for what the user presently wants to do. Even if it is not, it provides a stable starting point for further work. Having a stable starting point that the user becomes familiar with, enables a user to make rapid and minimal adjustments to get to the desired setting for the present task, assuming that no known saved setting is a closer starting point. If the oscilloscope is shared with other users, it is often desirable for the present user who finds the scope already turned on to initially go to the factory setting to make sure that the instrument is not in some strange mode left by the last user. This assumes that the power-up setup is among the stored setups available to recall, otherwise the same result will require turning the power off and on again. It is also useful to have an oscilloscope power-up to a known state for use in remote-programmed or remote-controlled situations. This allows the remote controlling program or operator to only send changes from the initial state, as opposed to having to send a command for every possible controllable parameter in order to ensure that the final state of the instrument is known.

Originally, the automatic function was limited to initial setup, and it ended its routine once that setup was achieved and the user took over. More recently, however, the automatic function on some oscilloscopes continued controlling the setup during operation, although such a mode is usually optional and may be shut off by the user. Within parts of the industry, this feature is known as "auto-ranging" or "continuous setup", so as to be distinguishable from the "auto-setup" in which the setup parameter control terminated after the initial setup. An auto ranging oscilloscope responds to simple changes in a simple input by modifying its horizontal sweep setting, its vertical gain setting, or, in some cases, even its trigger level settings, in response to the changed inputs.

U.S. Pat. No. 5,155,431 to Holcomb for "Very Fast Autoscale Topology for Digitizing Oscilloscopes", hereby incorporated by reference, describes an oscilloscope that can quickly achieve an appropriate setup by finding the signal maximum and signal minimum through the utilization of peak detection circuitry. U.S. Pat. No. 5,397,981 to Wiggers for "Digital Storage Oscilloscope with Automatic Timebase", hereby incorporated by reference, describes an oscilloscope that can adjust its timebase during operation to keep a constant number of cycles on the screen, even in the presence of a change in frequency of the input signal. Additionally, and apparently for the same type of application, the time axis of the display of this oscilloscope may be labeled in degrees per division instead of time per division.

Some oscilloscopes of the prior art have had the capability of making one or more automated measurements on a simple input signal, such as a sine wave or square wave. These measurements, which had to be selected by an operator, could include frequency (or period), duty cycle, peak-to-peak amplitude, or rise and fall times. For example, U.S. Pat. No. 4,362,394 to Menlove for "Time Interval Measurement Arrangement", hereby incorporated by reference, describes a method and apparatus to make accurate measurements on a complex repetitive waveform.

U.S. Pat. No. 4,779,044 to Skolnick et al. for "Voltage, Current and Frequency Measuring of Non-standard Waveforms", hereby incorporated by reference, describes one way that the period of a regular binary signal can measured by sensing transitions and using a counter to determine the interval between them.

U.S. Pat. No. 4,271,391 to Kmetz for "Digital Voltmeter with Electro-Optical Indication of the Waveform", hereby incorporated by reference, discloses a digital voltmeter that displays a waveform at maximum available vertical amplitude and also displays that voltage level as a numerical value.

U.S. Pat. No. 4,716,345 to Shank et al. for "Automatic Pulse Display", hereby incorporated by reference, describes a method for using two trigger detection circuits to trigger at the same level on opposite slopes of a pulse waveform. This provides a way to calculate the duty cycle of the waveform and position it on the screen. This oscilloscope can automatically expand and display an otherwise narrow pulse in the signal input to make the positive portion fill most of the display. This is convenient when a pulse type signal has a very low duty cycle (percentage of total period of the signal wherein the signal is in its "high" state.)

U.S. Pat. No. 5,637,994 to Carder for "Waveform Measurement", hereby incorporated by reference, discloses a way to measure the features of a waveform with indeterminate, i.e., variable, arrival times. The time between separate threshold crossings is measured as one of the threshold points is moved. This allows a point-by-point reconstruction of a repetitive waveform occurring at variable intervals.

U.S. Pat. No. 4,985,844 to Foley, et al. for "Statistical Waveform Profiler Employing Counter/Timer", hereby incorporated by reference, describes an oscilloscope system that repetitively performs pulse width measurements, and to enable this feature the system automatically determines suitable resolution and offset settings. U.S. Pat. No. 5,155,431 to Holcomb for "Very Fast Autoscale Topology For Digitizing Oscilloscopes", hereby incorporated by reference, describes an oscilloscope with dedicated peak detector hardware that operates in conjunction with a trigger counter to rapidly set the vertical scale and offset and the horizontal sweep rate.

Histograms provide a powerful tool for waveform analysis and instrument control. U.S. Pat. No. 4,985,844 to Foley et al. for "Statistical Waveform Profiler Employing Counter/Timer", hereby incorporated by reference, describes a histogram-based counting arrangement that makes measurements on repetitive input signals and uses the results as the basis for the generating a histogram. Histograms can also provide a basis for automated measurements, although more slowly than with some of the specialized approaches described elsewhere herein.

U.S. Pat. No. 5,495,168 to deVries for "Method of Signal Analysis Employing Histograms to Establish Stable, Scaled Displays in Oscilloscopes", hereby incorporated by reference, describes an oscilloscope system that uses both amplitude histograms and time histograms. The amplitude histogram method is used first to determine the minimum and maximum amplitude levels of the signal. Then a time histogram method is used to determine predominant time intervals occurring in the input signal.

U.S. Pat. No. 5,003,248 to Johnson for "Probability Density Histogram Display", hereby incorporated by reference, discloses an oscilloscope that optionally provides a probability density histogram alongside the conventional voltage-versus-time time-domain display of the waveform. U.S. Pat. No. 5,343,405 to Kucera at al. for "Automatic Extraction of Pulse Parameters from Multi-valued Functions", hereby incorporated by reference, shows how histograms can keep track of the occurrence of eye-pattern data over multiple acquisitions. Pulse parametrics defining various aspects of the signal under test can be determined from these histograms, which are in effect adding a third dimension to the display.

U.S. Pat. No. 5,793,642 to Frisch et al. for "Histogram based testing of analog signals", hereby incorporated by reference, describes how reference histograms can provide a quick and data efficient way to compare acquired waveform information with a reference waveform and rapidly communicate the results using limited information bandwidth. U.S. Pat. No. 5,122,996 to Sasaki et al. for "Real-Time Uninterrupted Time-Interval to Voltage Converter", hereby incorporated by reference, describes an oscilloscope-related feature that allows the viewing of signal periods as voltages, even while such periods and resulting voltages are changing from cycle to cycle.

U.S. Pat. No. 5,397,981 to Wiggers for "Digital Storage Oscilloscope With Automatic Time Base", hereby incorporated by reference, describes an oscilloscope system in which the operator makes a selection with regard to the horizontal axis and number of signal cycles desired, and an appropriate display is produced and maintained. U.S. Pat. No. 4,743,844 to Odenheimer, et. al., for "Self-adjusting Oscilloscope", hereby incorporated by reference, describes an oscilloscope system in which the vertical amplifier gain and offset, the trigger level, and the sampling rate of the digitizer can be automatically controlled in response to the input signal.

Certain specialized oscilloscope-like instruments are either built to, or may be programmed to, respond appropriately to more complex inputs, e.g., a television video signal. U.S. Pat. No. 5,027,058 to Kleck et al. for "Multi-standard Video Option for Oscilloscopes", hereby incorporated by reference, describes an oscilloscope that can determine which video standard a television video signal is compliant with, and set up the horizontal sweep accordingly. The type of horizontal sync pulse, bi-level or tri-level, and the width or number of lines per frame are used in making the determination of which video standard is being used.

The Tektronix TDS300, as well as the oscilloscopes offered by some competitors, also provides FFT (fast Fourier transform) waveform analysis so as to combine in one instrument some of the power of a spectrum analyzer as well as a conventional oscilloscope. Such built-in harmonic (frequency)-based displays proved useful in power supply design and communications applications, anywhere that a power-versus-frequency view of the signal would augment insight.

U.S. Pat. No. 5,375,067 to Berchin for "Method and Apparatus for Adjustment of Acquisition Parameters in a Data Acquisition System such as a Digital Oscilloscope", hereby incorporated by reference, discloses another digital oscilloscope that also analyzes the signal in the frequency domain. To maximize performance, this oscilloscope automatically adjusts the acquisition parameters to optimal values for a particular repetitive waveform. The acquisition parameters are adjusted such that the sampling rate is sufficient to avoid aliasing of the highest significant frequency components of the input waveform while accommodating all or substantially all of the waveform within the waveform memory capacity.

U.S. Pat. No. 4,802,098 to Hansen et al. for "Digital Bandpass Oscilloscope", hereby incorporated by reference, describes an oscilloscope that is capable of simultaneously displaying both a time domain waveform and a frequency domain spectrum. The bandwidth of the passband is automatically adjusted to minimize aliasing in the time domain display.

U.S. Pat. No. 5,138,252 to Ferguson for "Automatic Scaling for Display of Modulation Domain Measurements", hereby incorporated by reference, describes a method for examining an input signal and setting a modulation domain measuring instrument to a state which will produce a measurement and a stable, centered, properly scaled display of the signal automatically.

U.S. Pat. No. 5,081,592 to Jenq for "Test System for Acquiring, Calculating and Displaying Representations of Data Sequences", hereby incorporated by reference, describes an electronic device testing system having an additional capability of performing any one of a set of mathematical operations on a data sequence and displaying the resulting waveform in a new window.

Oscilloscopes currently on the market allow the operator to trigger on pulses defined by amplitude (such as runt pulses), logic state or temporal pattern, or events qualified by time, e.g., pulse width, glitch, slew rate, setup-and-hold, or time-out. Combinations of extended and conventional triggers also help display video and other difficult-to-capture signals. Advanced triggering capabilities such as these deliver a large degree of flexibility when setting up testing procedures and can greatly simplify measurement tasks. Moreover, software is now available in the marketplace that automates and simplifies power measurement, jitter analysis, and disk drive measurement.

In some more recent oscilloscope user interfaces, by using vertical and horizontal scale knobs or a mouse the user can see the signal waveform with more magnification or compression. A "zoom" feature can have both "zooming in" and "zooming out", with "zooming in" being magnification and "zooming out" being compression. This function can be controlled by drawing a box around a feature of interest in one waveform, e.g., by using a mouse, and then seeing the boxed portion of that waveform expanded for a more detailed view in another vertical location.

One oscilloscope manufacturer allows up to eight different views of waveforms stacked vertically, i.e., full length but reduced height. These can contain views of up to four different channels, combinations of those channels as processed by a math function calculator, and zoom window magnification or compression. Each of these views must be set-up by the operator and all are at least partially correlated with each other in the horizontal (time) dimension. Some oscilloscopes have long provided the capability of displaying an "XY" display, as well as conventional amplitude-versus-time (YT) display. An XY display shows one signal as a function of the other (instead of as a function of time).

Modern digital oscilloscopes typically provide some means for the user to save and label a setup that it may be desirable to return to. This can save the operator's time with frequently used setups and avoid needless confusion or memorization of how to reach relatively obscure or infrequently used setups. These modern oscilloscopes typically offer a variety of setup choices in menu form, and may have some version of the "autoset" or "auto-range" feature described at some length above. As has also been discussed above, many digital oscilloscopes on the market today are capable of performing automatic measurements of various kinds. At least one manufacturer provides measurement icons that can be dragged over a waveform feature, causing the oscilloscope to then make the measurement indicated by the icon.

The operator doesn't see a rendition of how the waveform will look., but rather is presented with an icon and instant or delayed labeling. Delayed labeling may be like the "ToolsTips"-type, the type wherein the function is described in words, abbreviations, acronyms that only appear when a cursor stops moving and is resting on an icon. To use this feature, the operator has to understand which measurement a particular icon may be intended to represent. The operator usually doesn't see a realistic rendition of how the next waveform view will look in that view. This interface can be constructed so that if a cursor lingers on it, permanent messages can be augmented by "pop-up" temporary messages.

What is desired is a different and more graphic and helpful way to continually present the oscilloscope operator with setup choices and convenient paths to other views.

BRIEF SUMMARY OF THE INVENTION

Multiple views of the signal are generated by a time-sharing use of the oscilloscope's acquisition hardware. The instrument software makes a set of measurements of the input signal, and from the results of those measurements classifies the input signal as to type. Signals of particular types implicitly select suites of views of the signal. The operator sees examples of the other views available while a related view is the main view. The initial main view is the first recommendation for this type of signal. It is shown relatively large and in detail, with measured values displayed on the screen. Alternate views, which may be shown as "live" miniature views, are displayed, perhaps in simplified form, alongside the main view. By clicking on them, these alternative views may be made to become the main view. The operator can add and modify views.

Each view comes with a set of measurements that are automatically performed and displayed on the screen with the waveform. These pre-selected measurements are performed immediately and automatically, thereby usually meeting the operator's needs without requiring any actions on his part. The oscilloscope software also tries to anticipate and present one or more alternative setups that the user might prefer. A different view of the signal comes with different automatic measurements, and presents the results of these measurements as annotations to the waveform image. These next alternative setups may be made available on a conventional menu list, or displayed at a reduced size, either as static icons or miniature "live" displays. The "live" version of these icons can show the user exactly what a next available display will look like, while keeping the emphasis on the presently displayed setup by showing it in a relatively maximum size view.

BRIEF DESCRIPTION OF THE SEVERAL VIEWS

Figure 3:
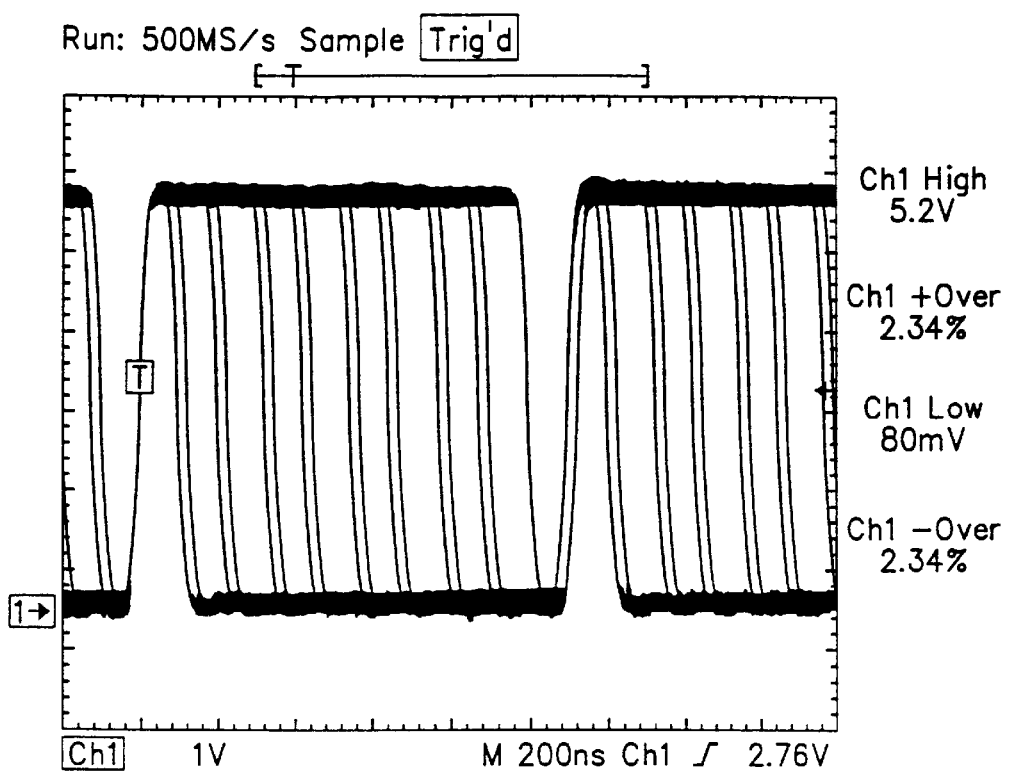

FIG. 3 is an example of the display of a "regular" logic signal having a varying duty factor, i.e., pulse width modulation. "Regular" refers to the constant period of a signal cycle, without regard to changes in the duty cycle or presence of pulse width modulation. The high and low voltage levels, and positive and negative overshoots, are automatically calculated and displayed alongside the waveform.

Figure 4:
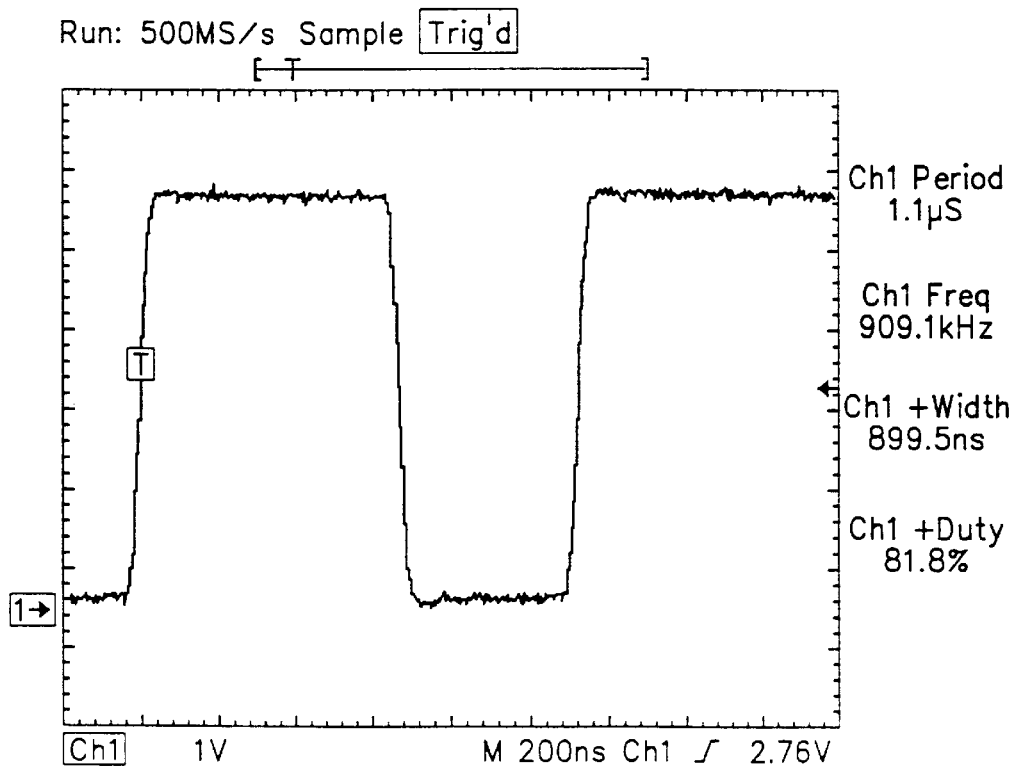

FIG. 4 is an example of the display of "regular" clock pulses. About one and a half cycles are shown. The period, frequency, positive width, and duty factor are automatically calculated and displayed alongside the waveform.

Figure 5:
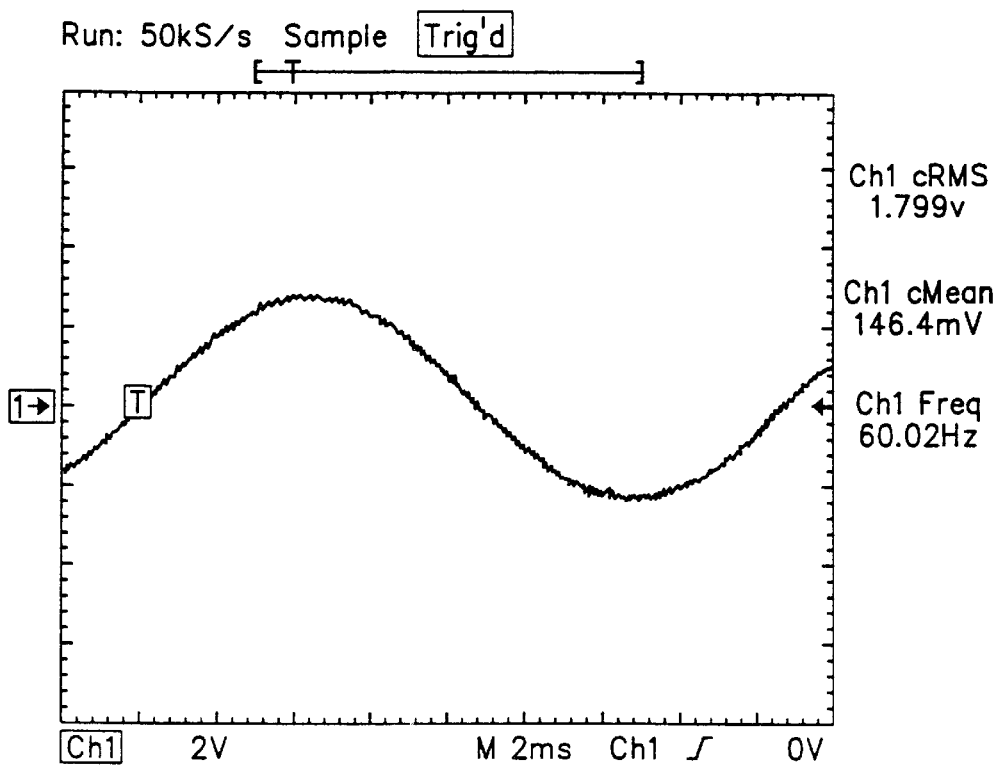

FIG. 5 is an example of the display of an AC power supply voltage. Slightly more than one period is presented. The cycle-RMS voltage, cycle-mean voltage, and the AC frequency are automatically measured and displayed alongside of the waveform.

Figure 6:
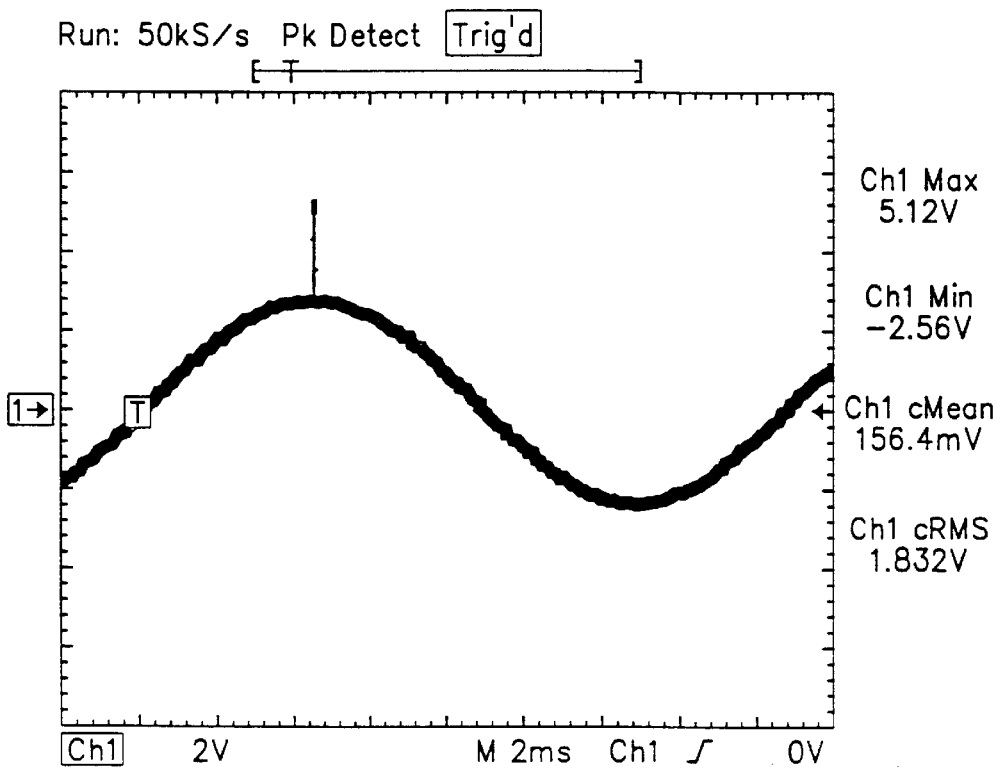

FIG. 6 is an example of the display of an AC power transient signal. Again, slightly more than one period is presented. The minimum and maximum voltages, as well as the cycle-RMS voltage and cycle-mean voltage, are automatically measured and displayed alongside of the waveform.

Figure 7:
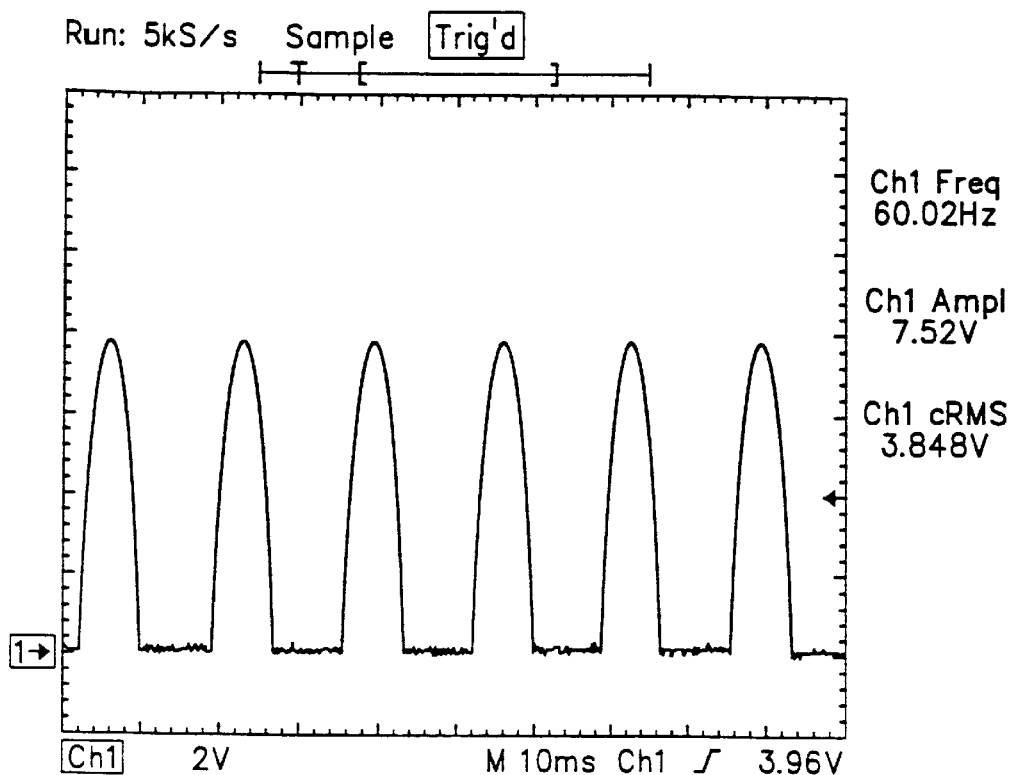

FIG. 7 is an example of the display of a half-wave rectified AC signal. The frequency displayed is the frequency of the signal after rectification. The frequency, amplitude, and cycle-RMS voltage are automatically measured and displayed alongside of the waveform.

Figure 8:
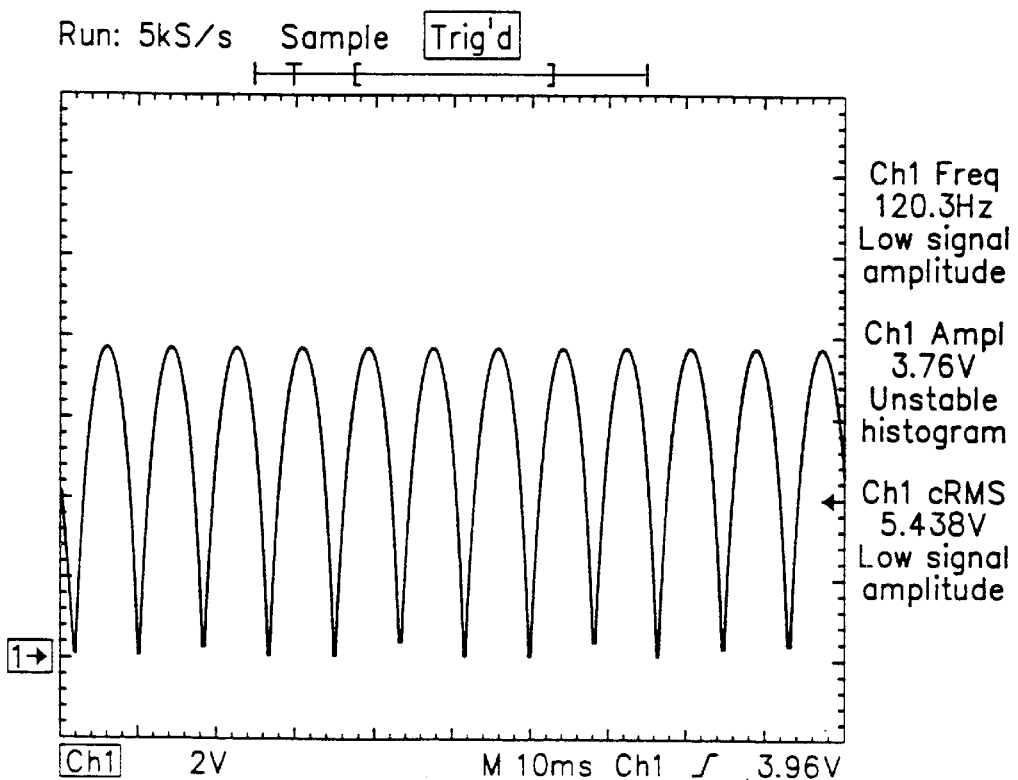

FIG. 8 is an example of the display of a full-wave rectified AC signal. The frequency of the rectified waveform, the amplitude, and the cycle-RMS voltage are automatically measured and displayed alongside of the waveform.

Figure 9:
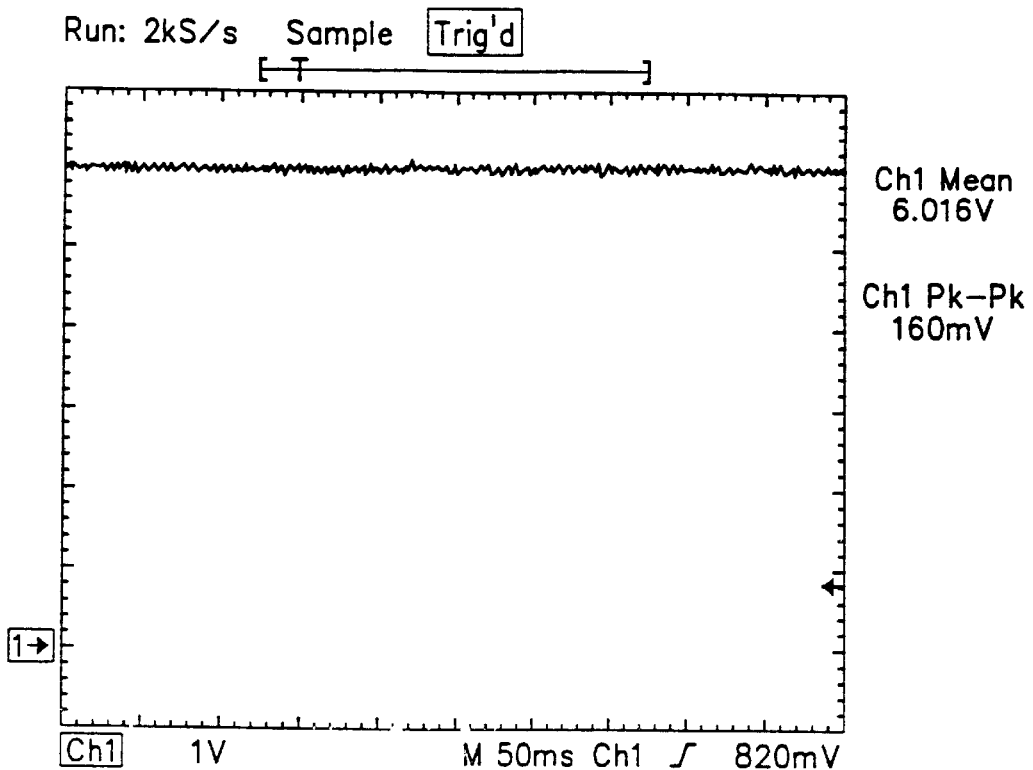
Figure 10:
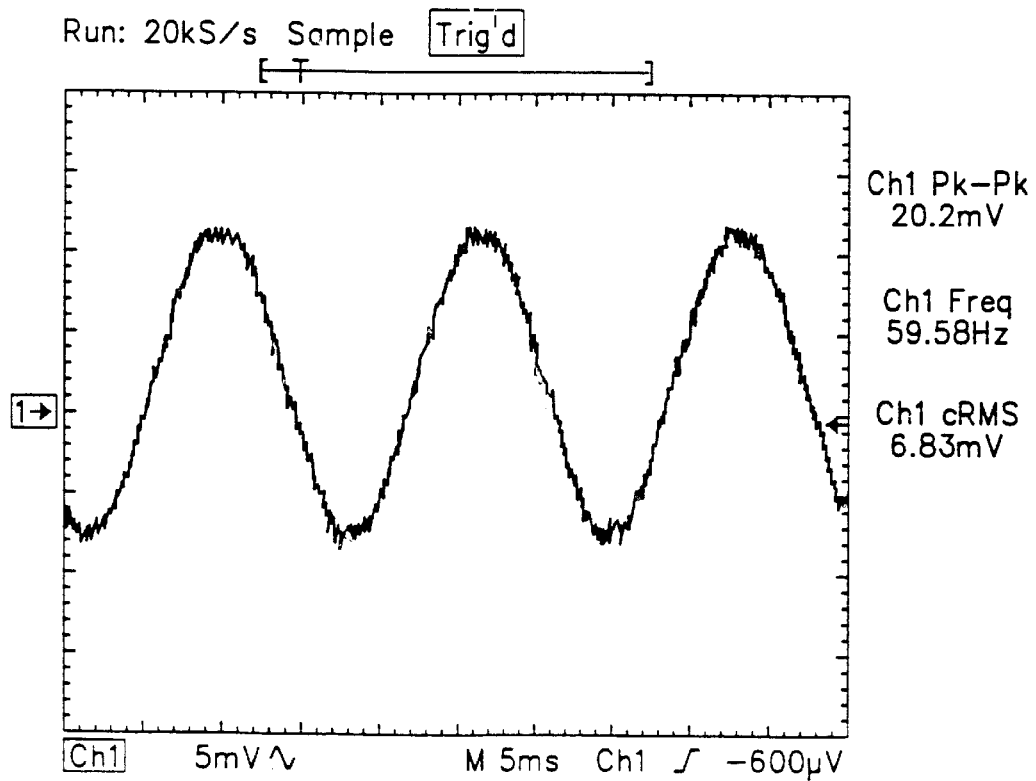

FIG. 9 is an example of the display of a DC voltage level. The mean voltage and the peak-to-peak voltage are automatically measured and displayed alongside the waveform FIG. 10 is an example of the display of a noticeable AC component riding on a DC level. The frequency and peak-to-peak voltage of the AC component, as well as the cycle-RMS voltage of the overall signal is automatically measured and displayed alongside the waveform.

Figure 11:
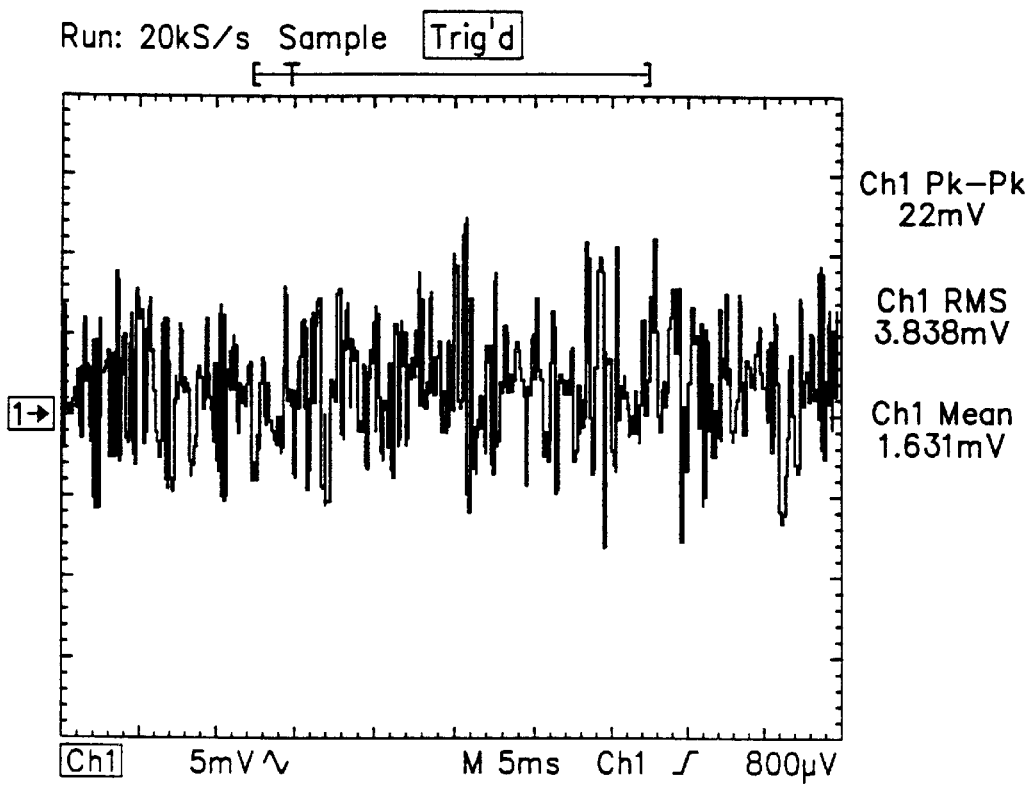

FIG. 11 is an example of the display of the noise riding on a DC level when there is no noticeable AC component. The peak-to-peak voltage of the noise, the mean voltage of the DC level, and the RMS voltage are automatically calculated and displayed alongside the waveform.

Figure 12:
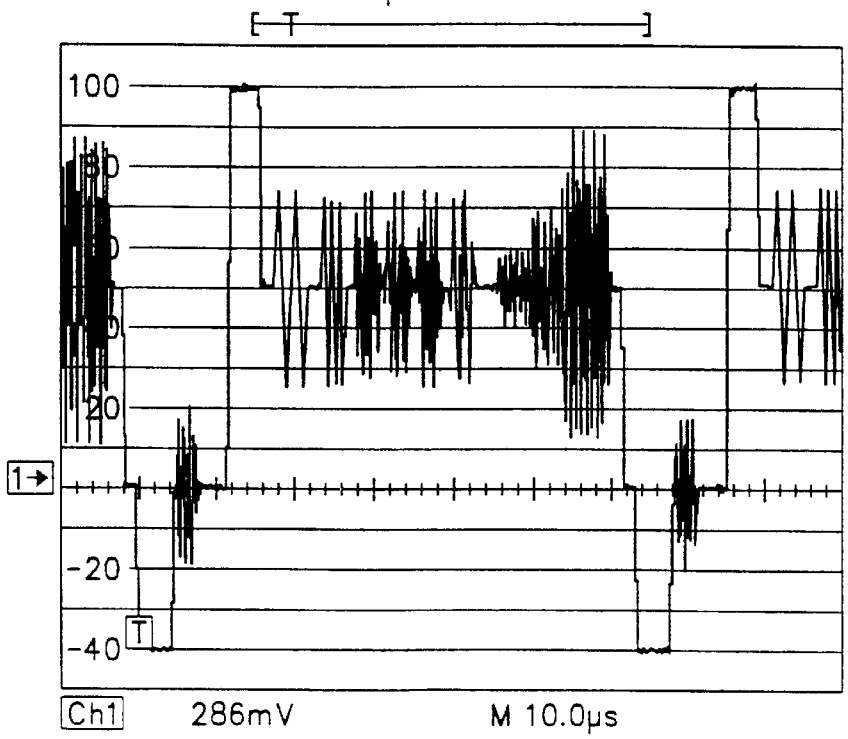

FIG. 12 is an example of the display of an NTSC format television video signal. The signal is automatically positioned, the gain set, and an appropriate graticule is supplied, so as to put the maximum amount of information in the screen display.

Figure 13:
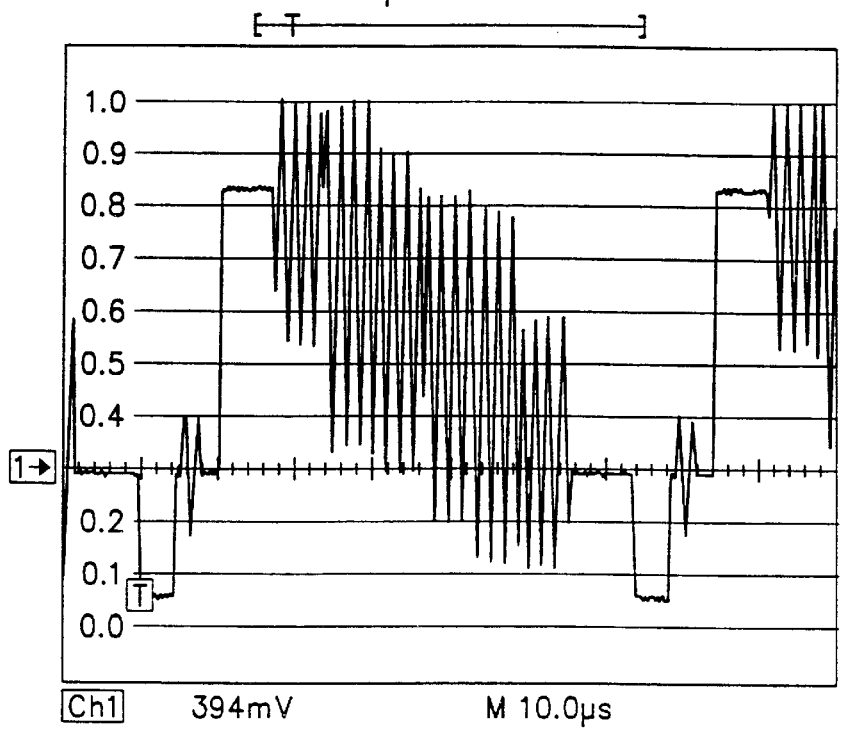

FIG. 13 is an example of the display of a PAL format television video signal. The signal is automatically positioned, the gain set, and an appropriate graticule is supplied, so as to put the maximum amount of information in the screen display.

Figure 14:
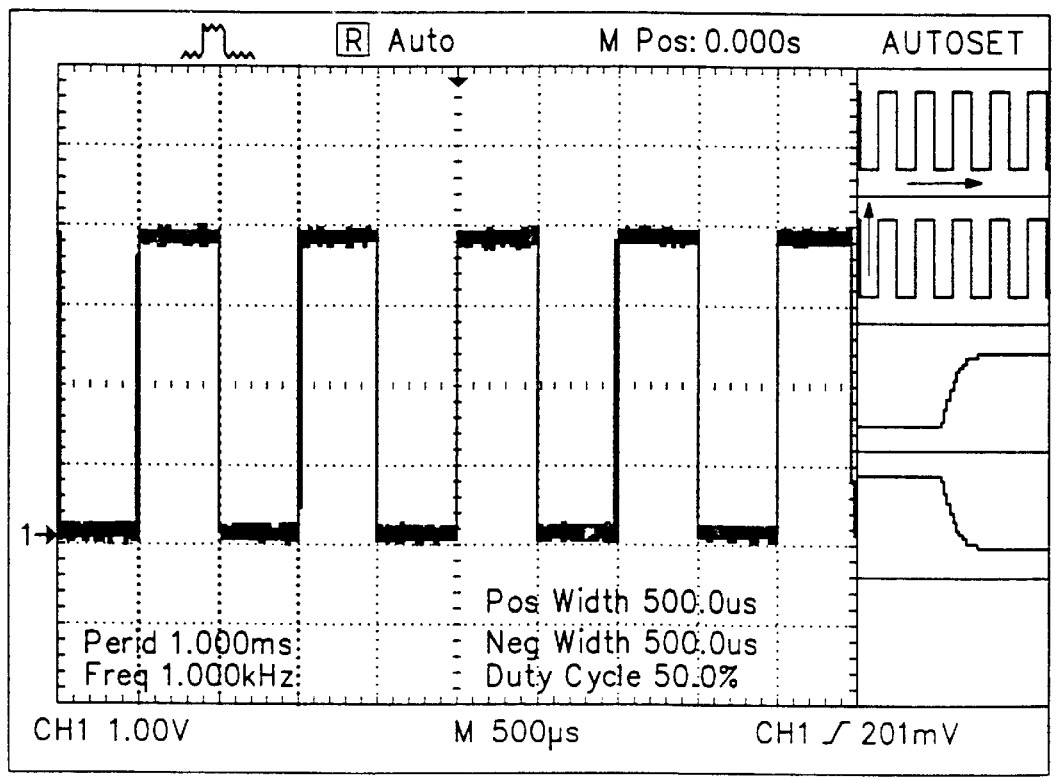

FIG. 14 is an example of the full size display of a regular digital clock signal waveform with iconic representations of anticipating of the current view and the views associated with next setup choices shown on the right. This view has the results of a number of time-related measurements displayed with the waveform, and the views produced by alternative setups shown in miniature on the right.

Figure 15:
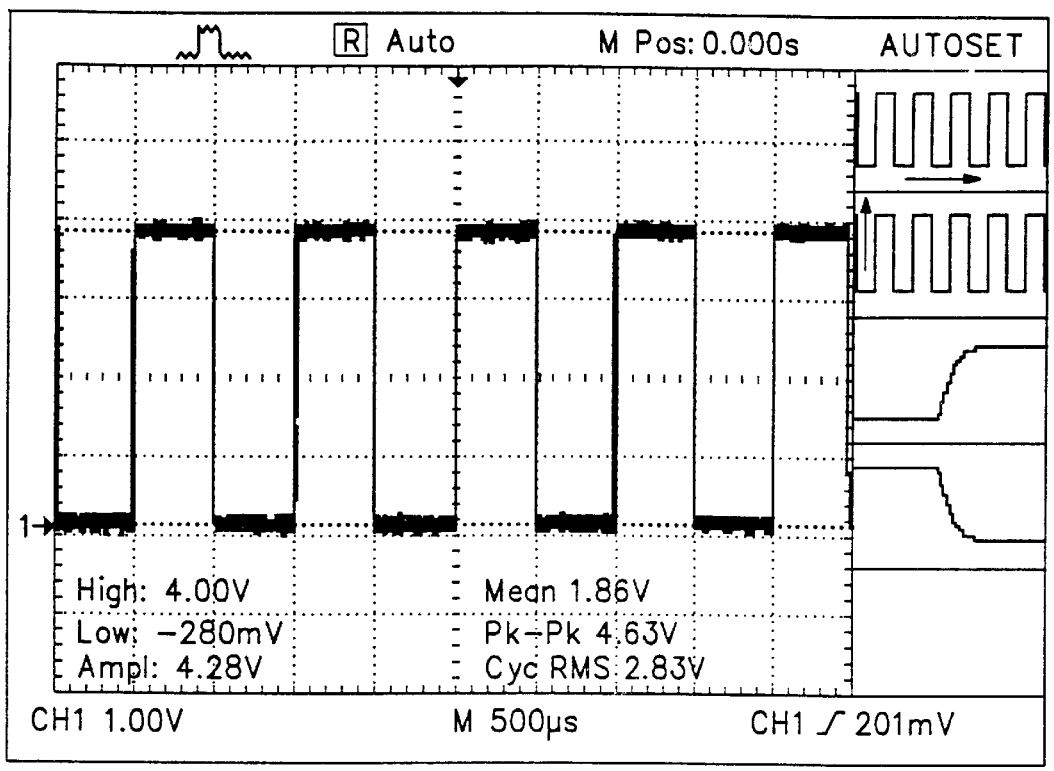

FIG. 15 is another example of the full size display of the same regular digital clock signal as is shown in FIG. 14. In this view it is accompanied by the results of a number of amplitude-related measurements. Again, the views produced by immediately available alternative setups are shown in miniature on the right.

Figure 16:
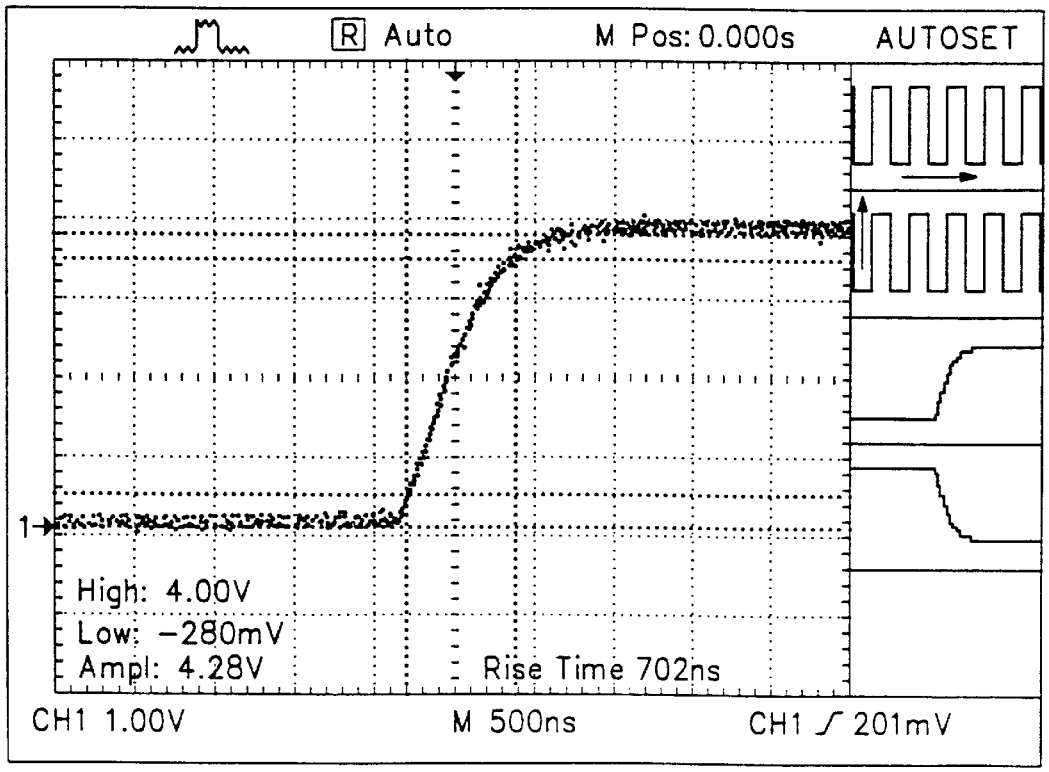

FIG. 16 is a full size view of the rising edge of the regular digital clock signal shown in FIGS. 14 and 15, and shown as a miniature view in the center of the five miniature view locations to the right of the full size view.

Figure 17:
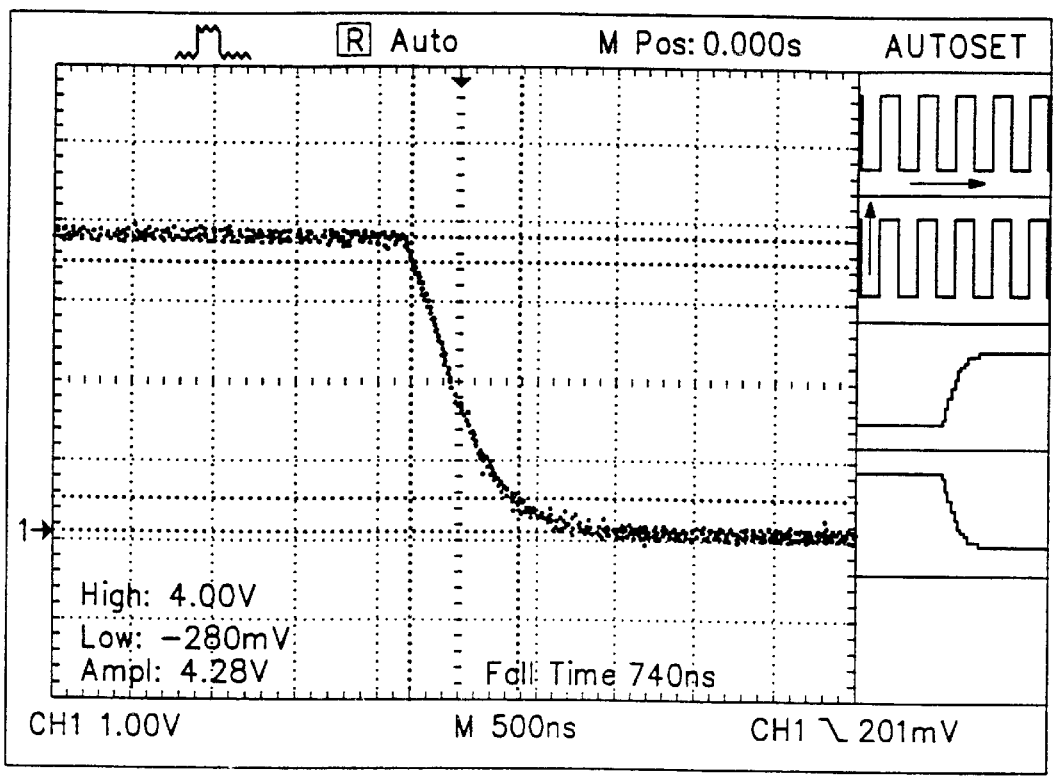

FIG. 17 is a full size view of the falling edge of the regular digital clock signal shown in FIGS. 14 and 15, and shown as a miniature view in the fourth of the five miniature views down the right side of the display.

Figure 18:
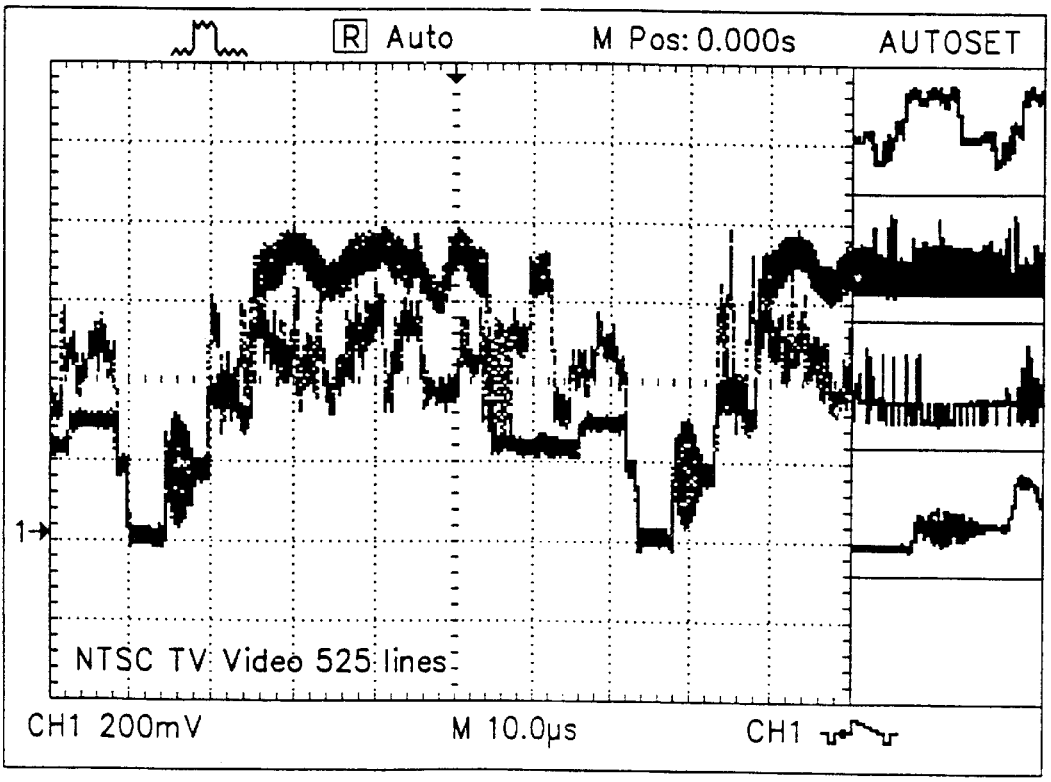

FIG. 18 is a full size view of a television video signal, with alternative views shown on the side and the video standard and oscilloscope settings shown in text associated with the main display.

Figure 19:
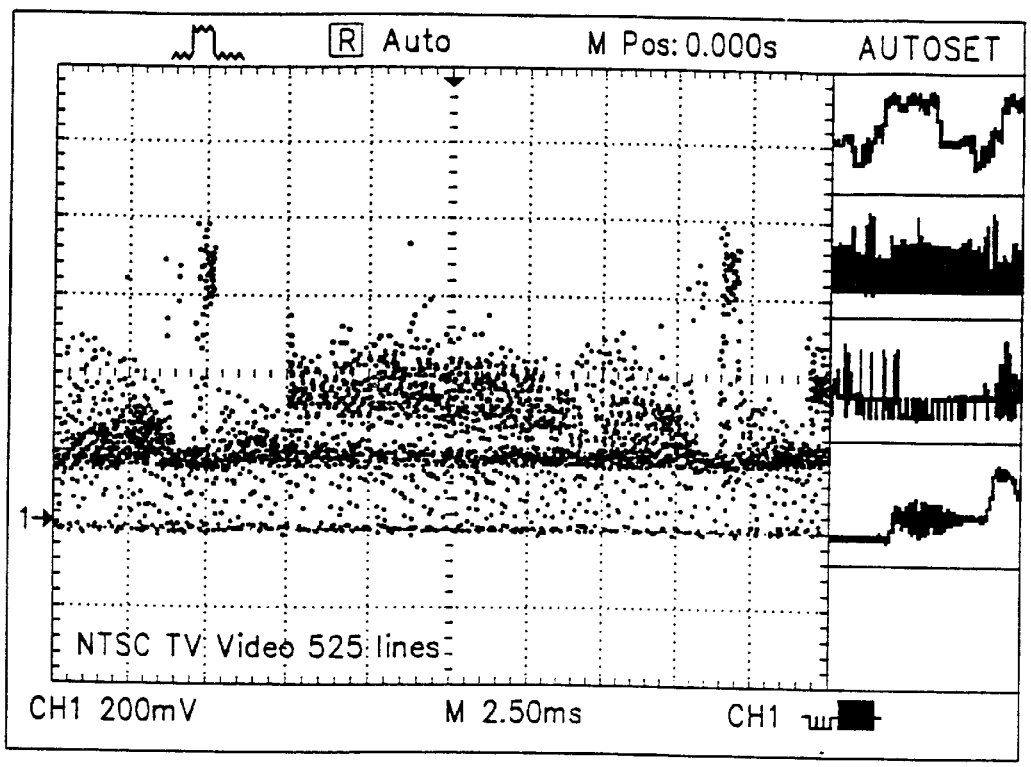

FIG. 19 is a full size view of part of the video signal views seen in miniature in the second alternative view of this figure and the preceding one.

Figure 20:
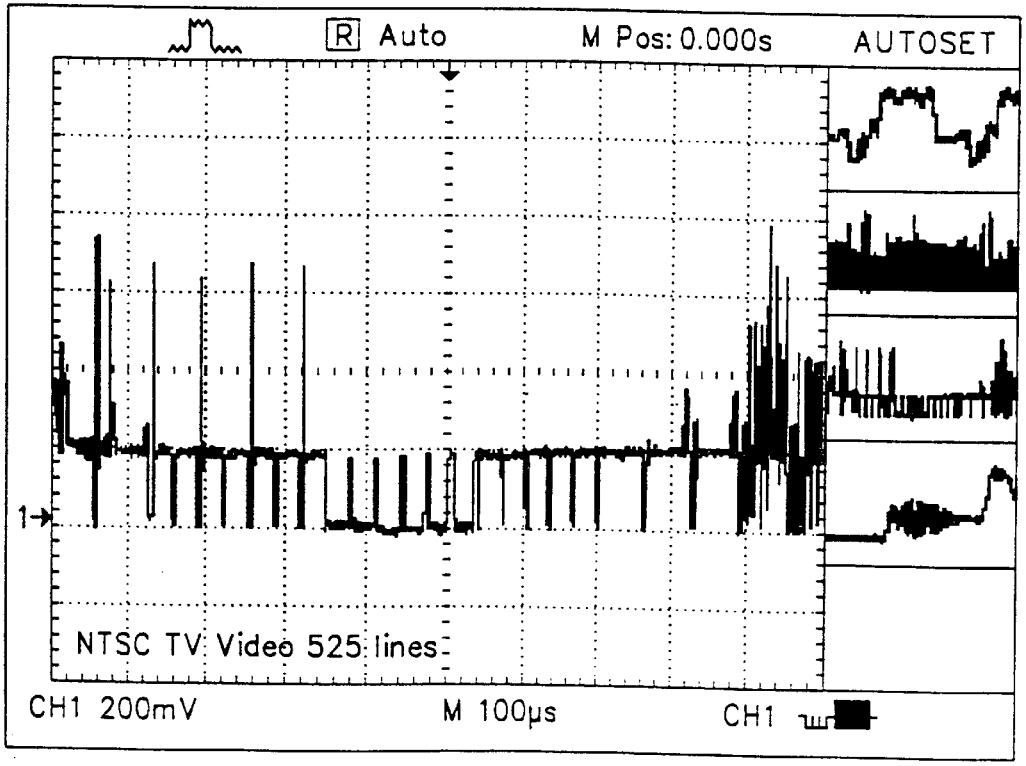

FIG. 20 is a full size view of part of the video signal views seen in miniature in the third alternative view of this figure and the preceding two figures.

Figure 21:
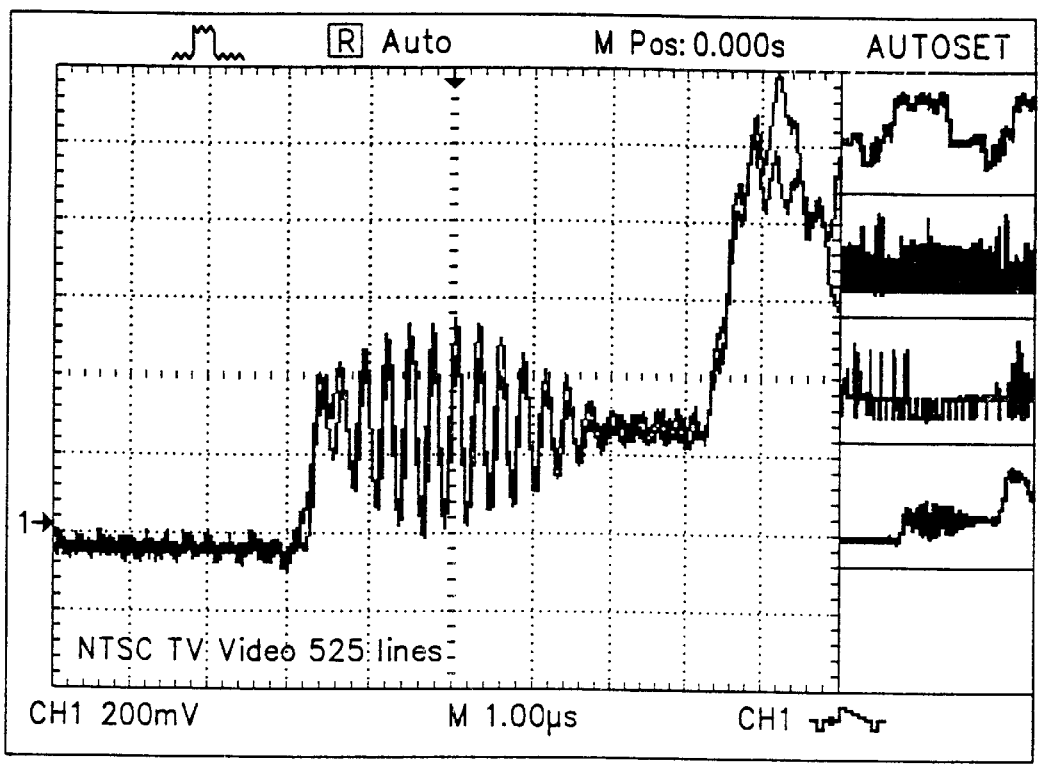

FIG. 21 is a full size view of part, the color burst, of the video signal views seen in miniature in the fourth alternative view of this figure and the preceding three figures.

Figure 22:
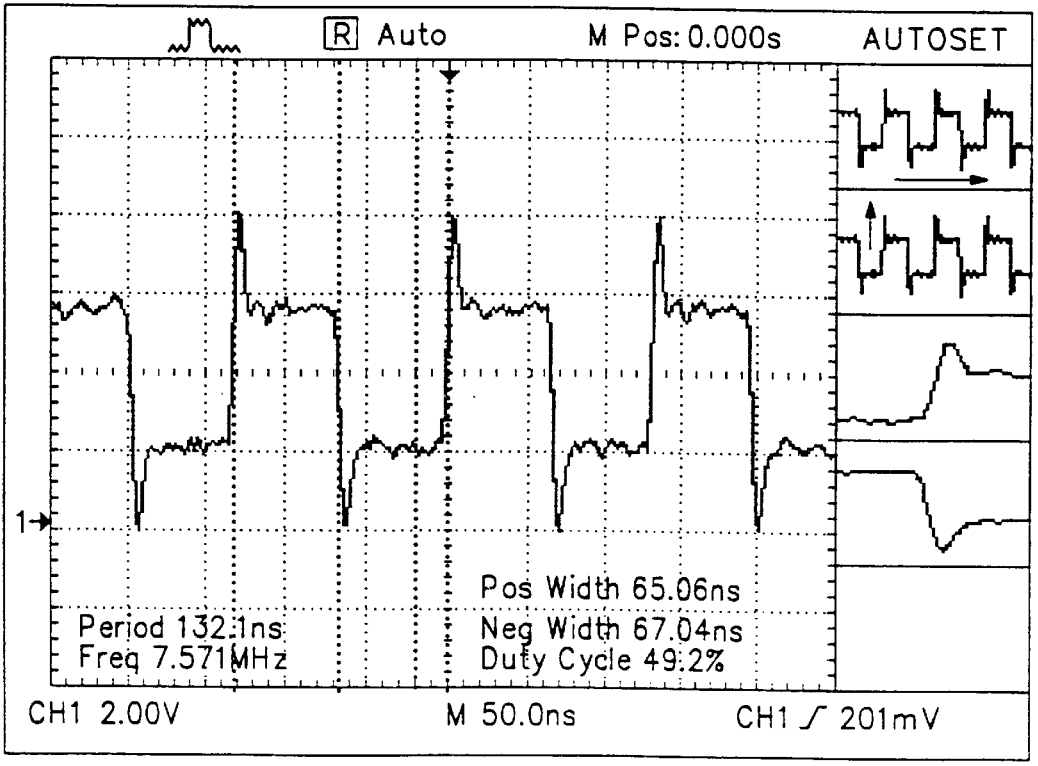

FIG. 22 is a full view and four miniature views of a microprocessor clock signal with significant overshoot. This version of the signal is annotated with time-related measurement results.

Figure 23:
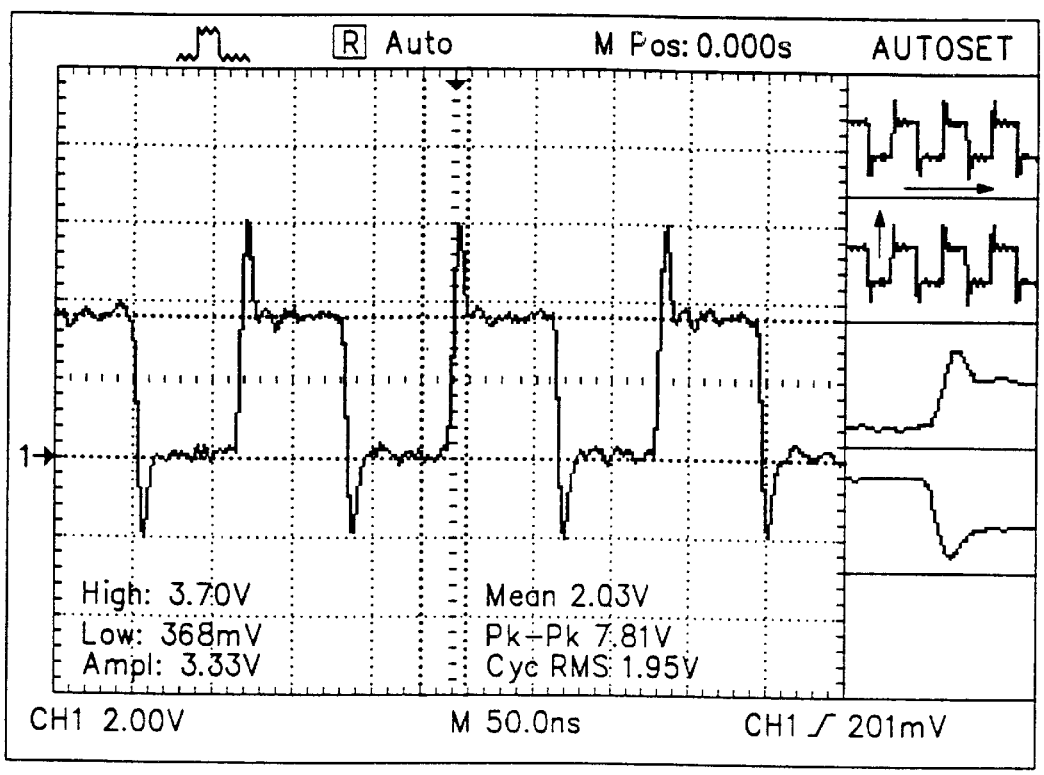

FIG. 23 is the full view of the same waveform as shown in FIG. 22, but in this figure the signal is annotated with amplitude-related measurement results.

Figure 24:
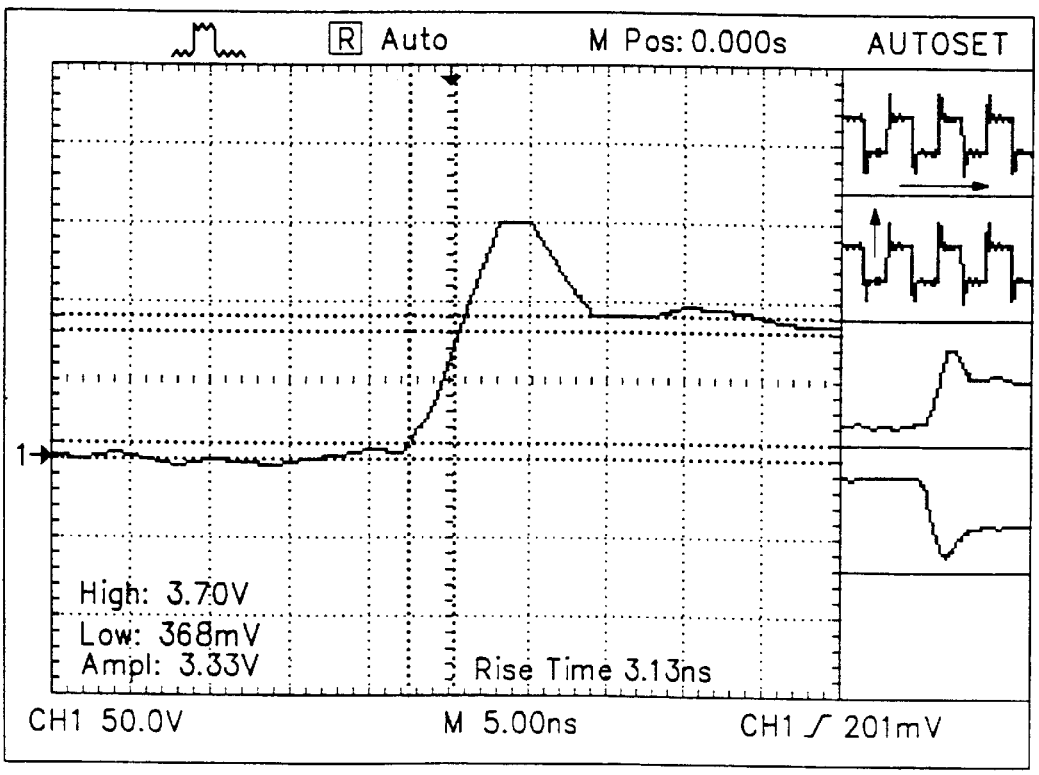

FIG. 24 is a full view of the expanded rising edge shown in the third alternative view of FIGS. 22, 23, 24 and 25.

Figure 25:
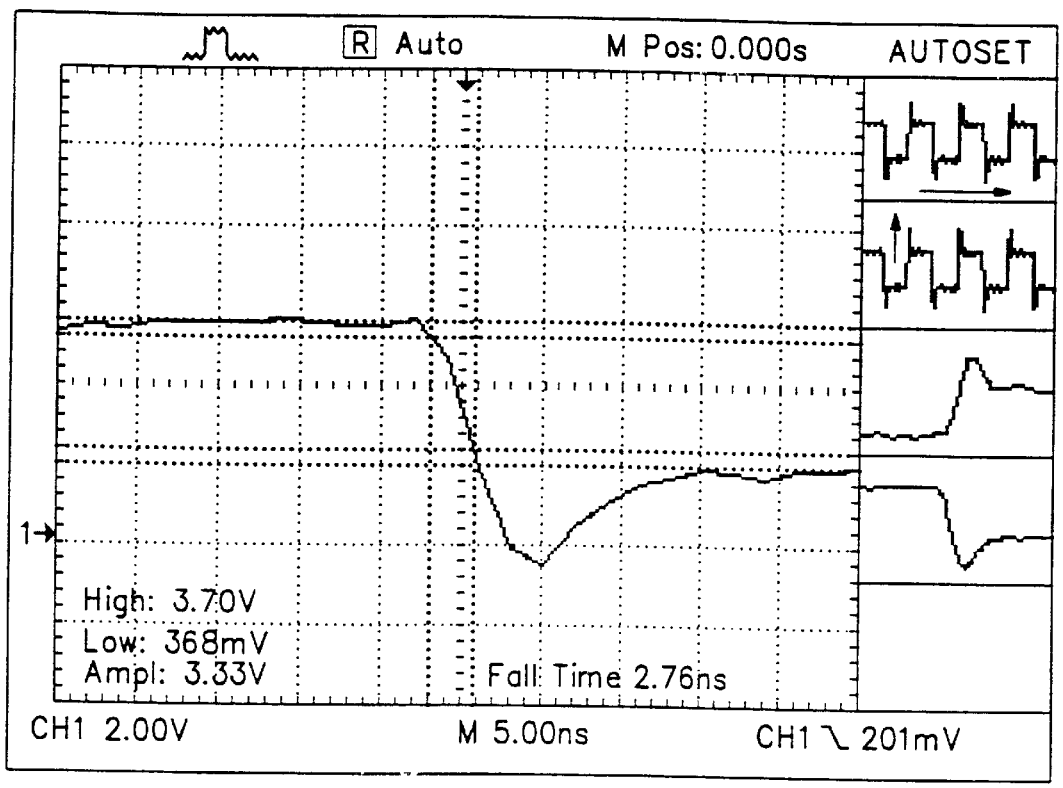

FIG. 25 is a full view of the expanded falling edge shown in the fourth alternative view of FIGS. 22, 23, 24 and 25.

Figure 26:
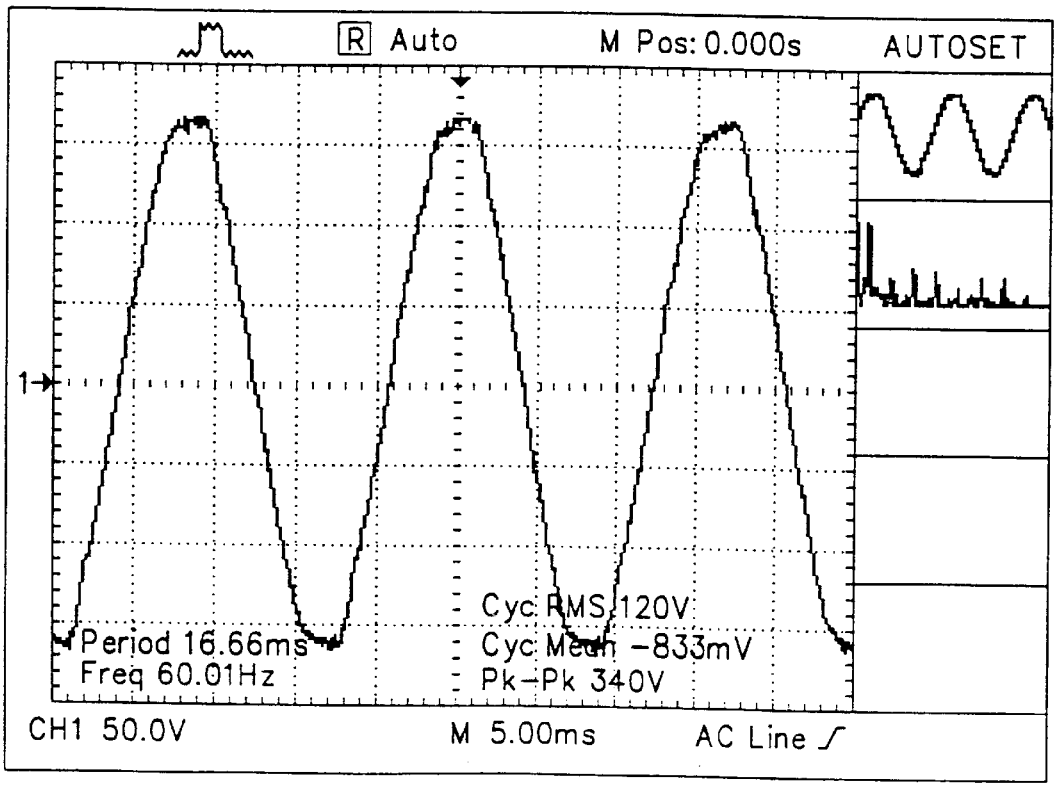

FIG. 26 shows a voltage-versus-time view of an AC power signal with time-related and voltage-related measurements shown in text at the bottom.

Figure 27:
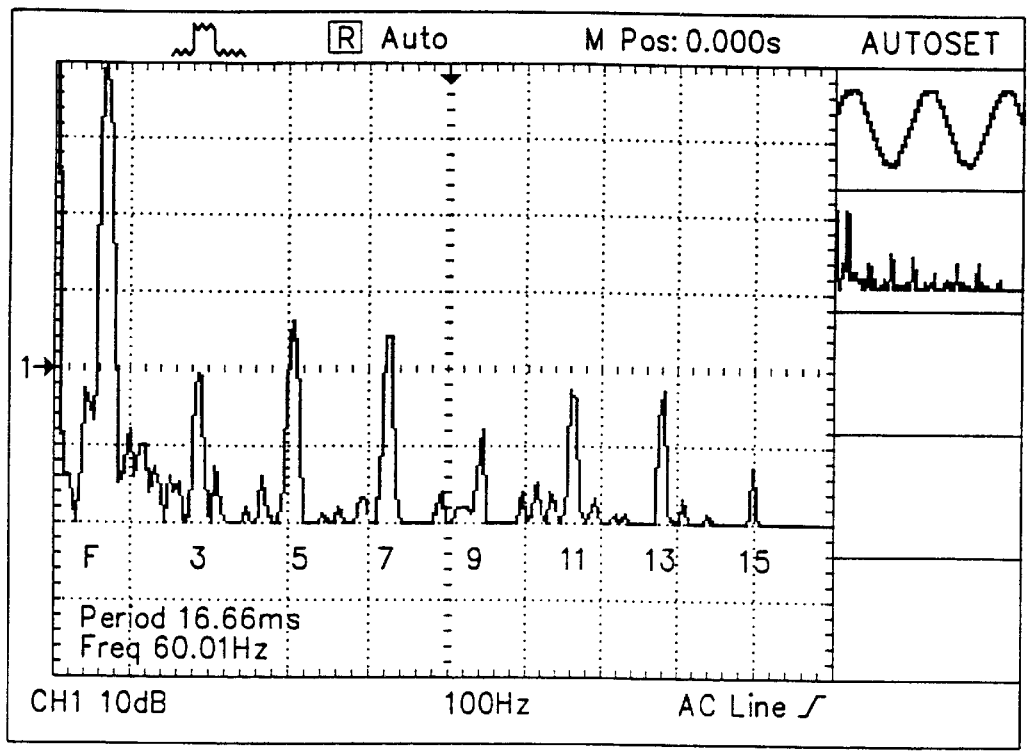

FIG. 27 shows at full size the amplitude-versus-frequency spectrum with the odd harmonics labeled. This same view is shown in miniature in FIG. 26.

Figure 28:
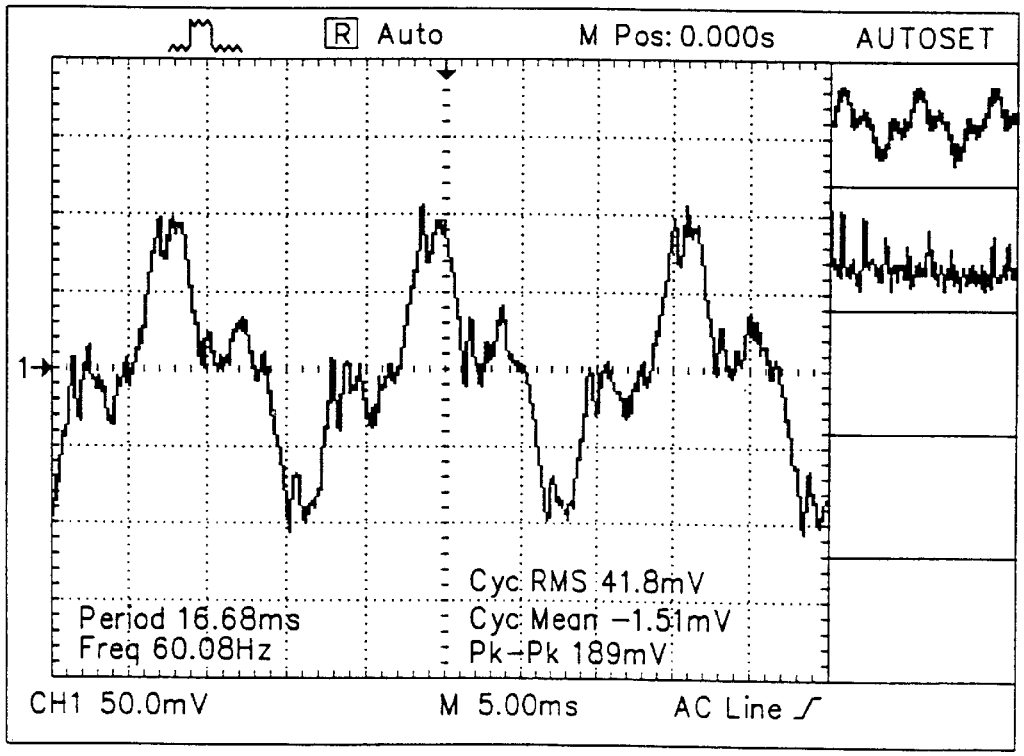

FIG. 28 is a full size voltage-versus-time view of an AC power main neutral line. It is annotated with the results of time-related and voltage-related measurements.

Figure 29:
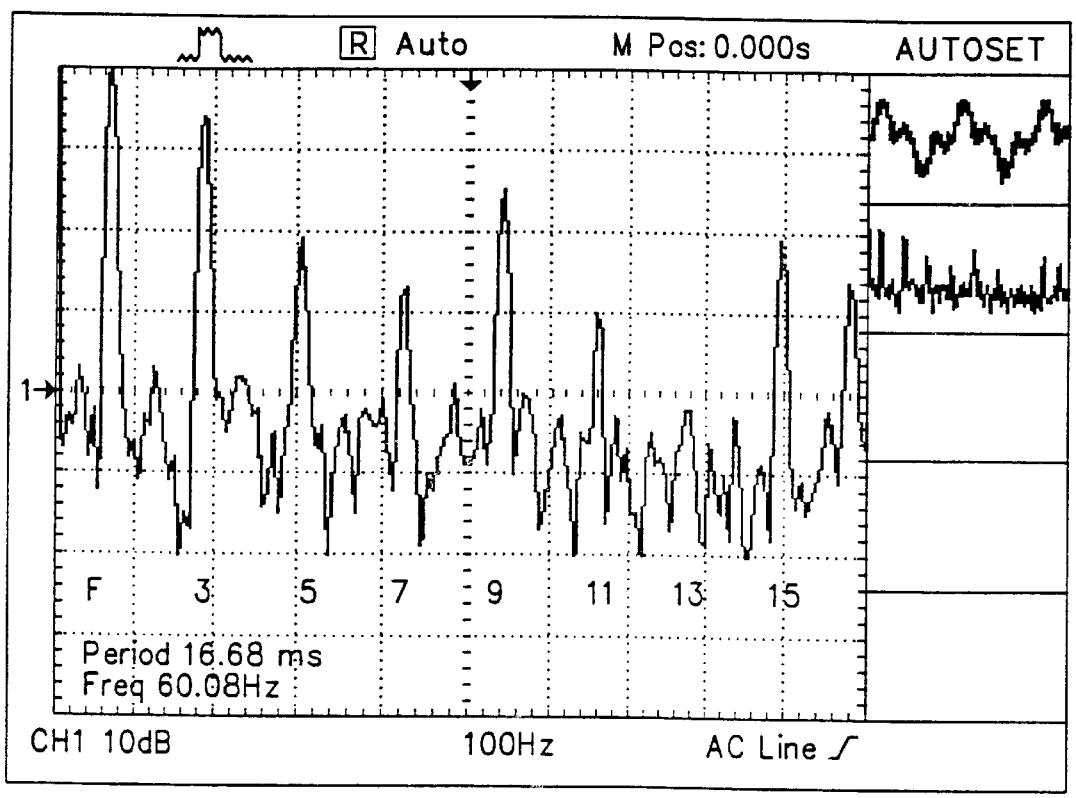

FIG. 29 is a full size frequency-versus-time spectrum of the signal shown in miniature in the second location in FIG. 28, with the odd harmonics labeled.

DETAILED DESCRIPTION OF THE INVENTION

Sets of oscilloscope settings are provided in clusters, grouped according to the suitability of the sets for use on the same type of waveform. The operator is provided with an initial view based on the type of signal under test, and then alternative sample views of the signal are presented for the operator's selection as "live" waveform images in miniature. Clicking on the sample waveform selects it to be the main waveform displayed. Groups of views can be linked to each other by signal or measurement type, or by operator choices.

The input signal is automatically classified as to type, which types may include: Irregular digital logic signals, i.e., those having two primary voltage levels and a varying period. Regular logic signals, i.e., those that are predominantly two-level signals, but with constant cycle-to-cycle periods (although not necessarily with constant duty factors). AC power voltages, e.g., those at frequencies such as 50 Hz, 60 Hz or 400 Hz. Rectified AC power voltages, both half-wave and full-wave, and DC voltages, including analysis of their noise and hum. And, to conclude a not necessarily complete list, television video signals according to any one of a number of standards, e.g., NTSC and PAL.

As much as possible, the oscilloscope is programmed to anticipate the choices that the operator would like to make next. Therefore, one or more alternative setups that the user might prefer are automatically made available as a next set of readily available setup choices. These alternative next setups may be made available on a conventional menu list or displayed at a reduced size, either as static icons or miniature "live" displays. The "live" version of these icons can show the user exactly what a next available display will look like, while the emphasis is maintained on the present view by displaying it at full size. Alternatively, a DMM-like display can be selected. In that display, the signal view is presented in miniature, while most of the display space is devoted to conveying information about the signal, in particular the results of a variety of measurements.

The oscilloscope according to the present invention continuously provides an auto-set function based on predefining the input signal into one of a number of predefined signal types. A suitable instrument setup, or group of setups, is associated with each signal type classification. A "setup" may include horizontal timebase settings, vertical amplitude multiplication factor (amplification/attenuation) settings, vertical signal offset settings, trigger condition settings, and display persistence and brightness settings. One of the setups associated with a given signal type is the default view, and is used until the user selects another view from the choices that are made available for that signal type or uses some other means of navigating through the oscilloscope's options and features. The choices that are made available as next views may be signified with a static icon or a miniature live display of that view.

The digital oscilloscope of the present invention is equipped with an "expert system" that has knowledge of signal types, and the types of information that may be extracted from each type. The signal present at the oscilloscope's input can be classified as one of the known types by making a series of automatic measurements and comparing the results with measurement characteristics associated with each of the definitions of the various signal types. The number of measurements to be made, and the sequence in which some of them are made, can vary with the results of previous measurements. Alternatively, if sufficient time is available, all of the measurements can be made each time that a signal is to be classified.

Typically, a voltage occurrence histogram can be the basis for a variety of initial measurements that aid in signal classification. High and low voltage levels, if present, are revealed, as are the signal extremes, positive and negative. As can be seen by examination of the patents discussed and incorporated by reference in the BACKGROUND OF THE INVENTION above, histogram generation and interpretation is well known in the digital oscilloscope arts. The automatic measurement suite can also include a measurement of the time between successive positive-going and negative-going trigger signals. The signal can also automatically be transformed into the frequency domain, where further information about it can be extracted.

Logic signals, which can be further classified as either "regular" or "irregular", will be identifiable from having two distinct voltage levels, a "top" and a "bottom". If they are regular logic signals, e.g., clock signals, they will have a main frequency spectral signal at their basic frequency. Irregular logic signals will have high amounts of odd harmonic content associated with their edges. Excursions beyond the "top" and "bottom" voltage levels can be measured and identified as overshoot and undershoot, noise, or an AC component, depending on spectral characteristics.

Signals that are not logic signals can be sinusoidal, as in an AC power, or a DC level, with or without an AC "hum" component, or noise and transients. Non-logic signals can also be much more complex, e.g., television video signals, containing both AC and DC portions, and regions that are intricate combinations of different frequencies and voltage levels.

Figure 1:
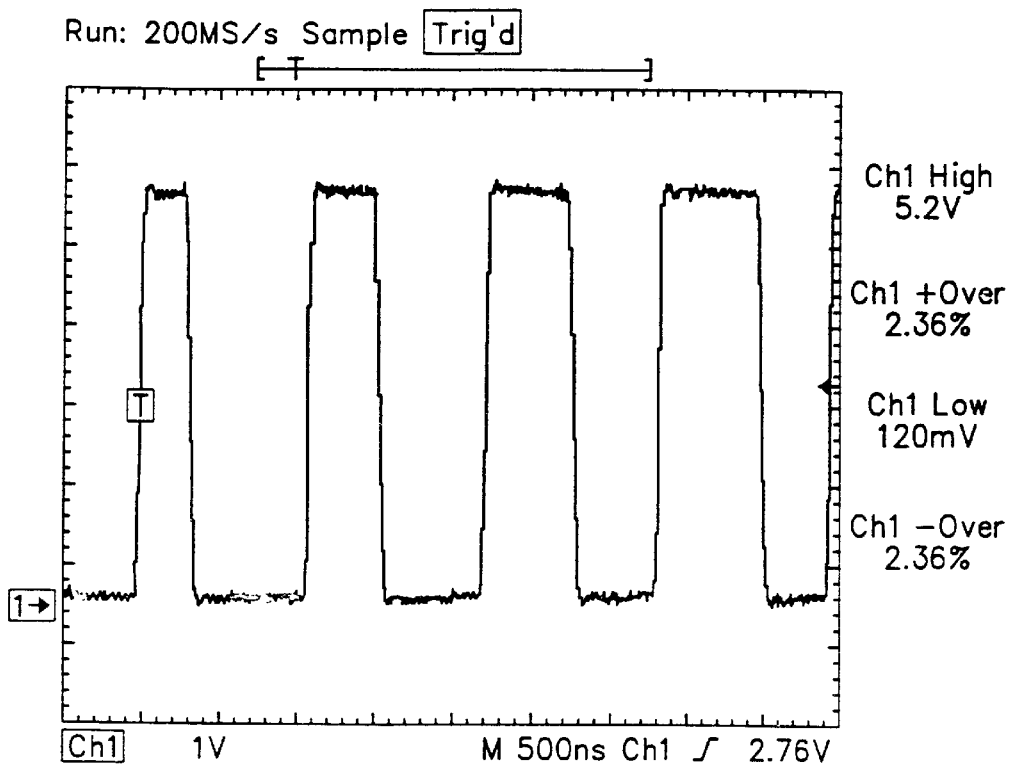
FIG. 1 is an example of the display of several cycles of an "irregular" digital logic pulse. High and low logic levels and overshoot and undershoot are calculated and displayed alongside the waveform. "Irregular" refers to the varying period of the signal.

FIG. 1 is an example of the display of several cycles of an "irregular" digital logic signal. High and low logic levels and overshoot and undershoot are calculated and displayed alongside the waveform. "Irregular" refers to the varying period of the signal. The display three or four cycles of irregular signals, whatever their periods or duty cycles might be. The other views that may be selected from this display are: rising edge, falling edge, or pulse width variations (overlaid).

Figure 2:
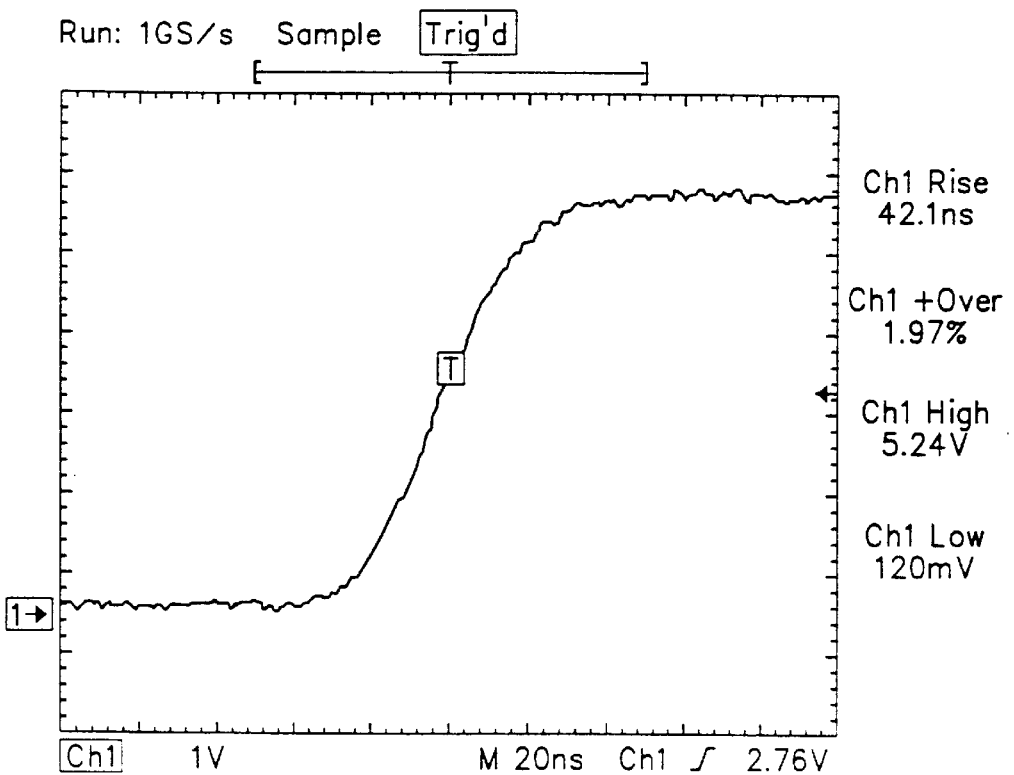
FIG. 2 is an example of the display of a rising edge. The rise time, overshoot, and high and low logic levels are automatically measured and displayed alongside the waveform.

FIG. 2 is an example of the display of a rising edge. The rise time, overshoot, and high and low logic levels are automatically measured and displayed alongside the waveform. To produce this display, the trigger level is set to 50% (of the difference between the high and low levels). The horizontal timebase and position is chosen to show the full transition, centered in the middle third of the display, with the first and last thirds of the display showing the levels before and after the edge.

Showing variations in the pulse width of irregular logic signals is performed by adjusting the timebase to show the widest pulses, as best it can be ascertained in a limited time, then triggering on the 10% position and choose vector accumulation and infinite persistence.

FIG. 3 is an example of the display of an "irregular" logic signal having varying duty factors or pulse width modulation. "Irregular" refers to the varying period of a signal cycle, without regard to changes in the duty cycle or presence of pulse width modulation. The period, frequency, positive pulse width, and duty cycle are automatically calculated and displayed alongside the waveform.

FIG. 4 is an example of the display of "regular" clock pulses. About one and a half cycles are shown. The period, frequency, positive width, and duty factor are automatically calculated and displayed alongside the waveform.

FIG. 5 is an example of the display of an AC power supply voltage. Slightly more than one period is presented. The cycle-RMS voltage, cycle-mean voltage, and the AC frequency are automatically measured and displayed alongside of the waveform.

FIG. 6 is an example of the display of an AC power transient signal. Again, slightly more than one period is presented. The minimum and maximum voltages, as well as the cycle-RMS voltage and cycle-mean voltage, are automatically measured and displayed alongside of the waveform. This view is one of the choices that is made available in the AC power supply voltage display.

FIG. 7 is an example of the display of a half-wave rectified AC signal. The frequency, amplitude, and cycle-RMS voltage are automatically measured and displayed alongside of the waveform.

FIG. 8 is an example of the display of a full-wave rectified AC signal. The amplitude, and the cycle-RMS voltage are automatically measured and displayed alongside of the waveform. Because a high level of noise on the lower part of the waveform, the measurement histogram is "blurred", and the message "Unstable Histogram" is presented. In an alternative embodiment, the software makes the determination that this waveform presents special measurement problems and doesn't display measured amplitude, but rather only a message alerting the operator to the nature of the problem. (The "low signal amplitude" warning also shows up here because this particular image was obtained while the signal amplitude was low.)

FIG. 9 is an example of the display of a DC voltage level. The mean voltage and the peak-to-peak voltage are automatically measured and displayed alongside the waveform FIG. 10 is an example of the display of a noticeable AC component riding on a DC level. The frequency and peak-to-peak voltage of the AC component, as well as the cycle-RMS voltage of the overall signal is automatically measured and displayed alongside the waveform.

FIG. 11 is an example of the display of the noise riding on a DC level when there is no noticeable AC component. The peak-to-peak voltage of the noise, the mean voltage of the DC level, and the RMS voltage are automatically calculated and displayed alongside the waveform.

FIG. 12 is an example of the display of an NTSC format television video signal. The signal is automatically positioned, the gain set, and an appropriate graticule is supplied, so as to put the maximum amount of information in the screen display.

FIG. 13 is an example of the display of a PAL format television video signal. The signal is automatically positioned, the gain set, and an appropriate graticule is supplied, so as to put the maximum amount of information in the screen display.

The determination of the signal type dictates which set of measurement setups are used to display the signal. One of these is the default setup and it is used automatically in the initial view of the signal. The operator can select other setups in this set of setups, and can also make one of the other setups the default setup for this set. The alternative suitable setups for the current signal type can be presented for operator selection as menu items, or icons, or even miniature "live" views of how the signal under test will look in the other setups.

Presenting the alternative "live" miniature views requires multiplexing the multiple setups into the control flow for the instrument. The instrument hardware operates in a time-shared, multitasking mode of operation to provide all of the needed "live" displays seemingly "simultaneously". Obviously, multiple setups that are individually time intensive collectively may make changes-in the waveform "sluggish" or "jerky", but this is not a problem in the usual case.

FIG. 14 shows a regular digital clock signal with the results of several time-related measurements shown. These include the Period, Frequency, Positive Width, Negative Width, and Duty Factor. The four miniature displays shown on the right side of the screen are, respectively, the present full display with time-related measurement results, a display in which the waveform shown is the same but the measurements are all amplitude-related instead of time-related, a rising edge and a falling edge. The set of setups for this signal type does not include a fifth alternative, and so the bottom alternative display view is blank. Note that the horizontal arrow in the top miniature display indicates that it represents the waveform display with time-related measurements, while the vertical arrow in the second (from the top) miniature display indicates that it represents the waveform display with amplitude-related measurements.

FIG. 15 shows the same regular digital clock signal as is shown in miniature in the second box on the right of FIG. 14. This version of the waveform comes with a collection of amplitude-related measurement results. These include the High and Low voltages levels, the Voltage Amplitude, the Mean voltage, Peak-to-Peak voltage, and cycle-RMS voltage. Again, the four miniature displays shown on the right side of the screen are, respectively, the FIG. 14 display with time-related measurement results, the present display with its amplitude-related measurement results, the rising edge view and the falling edge view. As in FIG. 14, the bottom alternative display view is blank as this set of setups does not include a fifth view. And, again, the horizontal arrow in the top miniature display indicates that it represents the waveform display with time-related measurements as shown in FIG. 14. Similarly, again, the vertical arrow in the second (from the top) miniature display indicates that it represents the waveform display with amplitude-related measurement, the one shown in FIG. 15 at full size.

FIG. 16 shows in the full size view the rising edge of the regular digital clock signal as is shown in the third miniature view of FIGS. 14, 15, and 16. The top and second miniature views on the right of FIG. 16 correspond to the waveform shown in the full size views of FIGS. 14 and 15, respectively. FIG. 17 shows in the full size view the falling edge of the regular digital clock signal as is shown in the fourth miniature view of FIGS. 14, 15, 16 and 17. The top and second miniature views on the right of FIG. 16 correspond to the waveform shown in the full size views of FIGS. 14 and 15, respectively. The middle miniature view on the right of FIG. 17 is the same rising edge shown in full size in FIG. 16.

FIG. 18 is the video waveform showing somewhat more that a full line of video. The triggering mode is to trigger on each line. The display mode is to display the signal using grayscale to show an activity histogram as a third dimension. The readout indicates that this is a full size view of an NTSC TV Video signal with 525 lines per frame. That information, as well as the vertical axis and horizontal axis oscilloscope settings and the channel displayed, is shown in on-screen text. Alternative views available via different TV setups are shown in the miniature displays on the right. The top view there is the same one shown at full size. The next is for triggering on any field, the following for a user selectable line number, and the last for the color burst. A specialized TV graticule can optionally be used with the display of television video signals. Such displays include IRE and mV video graticules.

FIG. 19 shows somewhat more than a complete frame of video. This is the full size version the second miniature view on the right, where the same views as are seen in FIG. 18 are shown here. FIG. 20, the third figure in this series, shows at full size the third miniature view of this TV signal as it is shown at the right of the screen. FIG. 20 is the video waveformn showing the vertical retrace interval. The triggering mode is to trigger on the start of a new frame. The fourth miniature view on the right, the color burst, is shown at full size in FIG. 21, the last in this series of TV signals.

FIGS. 22, 23, 24 and 25 show different views of a microprocessor clock signal with considerable overshoot. As in FIGS. 14–17, each successive full size view in this sequence corresponds to one of the miniature views shown in the right in each figure. FIG. 22 is the full view of this signal with time-related measurement results shown in text at the bottom of the screen. FIG. 23 is the same view with amplitude-related measurement results shown in the text at the bottom of the screen. The voltage values for the average overshoot could also be shown in this view. FIG. 24 is the expansion view of the rising edge, while FIG. 25 is the expansion of the falling edge of the same signal. The latter two signals are annotated with the high and low voltage levels, their difference, and the rise and fall time intervals, respectively.

FIG. 26 shows a voltage-versus-time view of an AC power signal with time-related and voltage-related measurements shown in text at the bottom. The second miniature view shown on the right of FIG. 26 is shown at full size in FIG. 27. This is an amplitude-versus-frequency spectrum with the odd harmonics labeled. FIG. 28 is a voltage-versus-time view of an AC power main neutral line. It is annotated with the results of time-related and voltage-related measurements. The second miniature view shown in FIGS. 28 and 29 is shown at full size in FIG. 29. It is the amplitude-versus-frequency spectrum of the signal shown in FIG. 28, again with the odd harmonics labeled.

The following Table of Signal Types shows sources, attributes, and automatic measurements for a variety of signal types, but it is not necessarily comprehensive or the only way they might be classified.

| TYPE | SOURCES | ATTRIBUTES | MEASUREMENTS |
| --- | --- | --- | --- |
| AC (Line) Power | Outlets, Transformers | 50 or 60 Hz<br>Any amplitude<br>Very small DC offset<br>Approx. Sinusoidal | Frequency<br>RMS voltage<br>DC offset, if > nominal<br>Harmonic Distortion, if . . .<br>Spurious Noise |
| Half-Wave Rectified AC | Wall-wart supplies<br>Consumer products<br>Low Speed Control, e.g., hair dryer | 50 or 60 Hz<br>Any amplitude<br>DC offset, 25% of peak<br>Spectra:<br>Fundamental @ 50% pk<br>Even harmonics | Frequency<br>RMS (or Peak) voltage<br>DC offset, if > nominal<br>Harmonic distortion, if . . .<br>Spurious noise |
| Full-Wave Rectified AC | All sort of power supplies<br>Wall wart power supplies<br>Consumer products | Frequency = 2 × Line<br>Any amplitude<br>DC offset, 50% of peak<br>Spectra well defined<br>Fundamental Frequency plus all harmonics | Frequency<br>RMS voltage<br>DC offset, if above nom.<br>Harmonic distortion, if . . .<br>Spurious noise |
| DC (or "no signal") | Any DC source or level | Very small peak-to-peak as % and absolute | DC voltage, average<br>Peak-to-peak variations<br>AC or noise spikes |
| Square Wave, generic | Two voltage levels, with fast transitions | Detectable by histogram<br>Spectrum varies with duty factor | Frequency<br>Duty factor<br>DC offset, hi-low average<br>Peak amplitude |
| Triangle Wave, generic | All transitions, no level | Clues from histogram<br>Check for monotonicity<br>Check for linearity | Frequency<br>DC offset, hi-low average<br>Peak amplitudes<br>Degree of asymmetry |
| Sawtooth, a.k.a. ramp | Triangle with one very fast/vertical side | Well know spectrum<br>Identifiable version of triangle wave | Frequency<br>DC offset, hi-low average<br>Peak amplitudes |
| Sine Wave | Not 50 Hz or 60 Hz and near-zero offset | Single peak frequency spectrum | Frequency<br>Amplitude: peak, peak-to-peak, or even RMS<br>DC offset (if not zero)<br>Harmonic distortion, if . . . |
| Digital Logic | Uneven square wave,<br>Usually low near zero,<br>high typ. @ 3 V or 5 V | 2-Level Histogram<br>Check levels for known logic families | High & Low voltages<br>Rise & Fall times<br>Ringing, over/under-shoot<br>Frequency, of regular<br>Else pulse width variation<br>Allow jump to view edges |
| Serial Data | Encoded ASCII data | 2-Level Histogram<br>Appearance varies with protocol | Voltage levels<br>Protocol identified<br>Show data stream, if can |
| I²C | Serial protocol | Use two channels if extra wire used | Bit rate<br>Device being addressed<br>Data being transferred |
| Pulse-Width Modulation | Used in control applications | 2-Level Histogram<br>Varying pulse widths | High & Low voltages<br>Base period (or freq.)<br>Description of modulation |
| AM & FM | Communications Test | Identify spectra | Carrier & modulation freq<br>Modulation levels<br>Amplitude<br>DC offset, if present |
| Video | Known standards<br>Emerging standards | Spectrum related to scan | Standard<br>Scan rate, number of lines<br>Specific measurements? |
| Audio/Voice | Applications? | Spectrum < 20 KHz | Spectrum, real-time |
| Chopped Sine Wave | Power adj. by cycle time | Spectrum at line freq.<br>Higher order harmonics | Line Frequency, Voltage<br>%-on time of voltage<br>RMS of signal |
| Modulated AC Carrier | Data over power lines | | |

Stored user choices can select, or create and then select, setup templates. User created templates are formed whenever a user creates a unique setup and indicates by pushing a button or clicking at an indicated spot on the screen that this setup should be saved. The operator is then asked to create a name by which to identify and access this new setup template. The operator can also make a new setup or an existing setup part of some other set of setups than the one with which it is associated by default. The operator associated set of setups can be either a preexisting one or a new one. The preexisting sets of setups are either the ones supplied with the instrument or ones previously created by users.

The sets supplied with the instrument software have standard names describing the type of signal or kind of working environment that they are intended for use with. Those created by the user may also have signal-oriented, working-environment-oriented names, individual-based names, or names that are based on a combination of these. This allows different users to keep customized sets of setups that are similar in function to those of other individuals, but distinguishable from them nonetheless.

Sets of setups can also have an attribute that identifies their function to the software. These attributes can include such functional characteristics as: triggering, measuring time-related features, measuring amplitude-related features, comparing, etc. Users can ask to see sets of setups organized according to this characteristic information, thus allowing them to look for setups of a particular type, as well as those originally supplied with the software or oscilloscope.

While a preferred embodiment of the present invention has been shown and described, it will be apparent to those skilled in the art that many changes and modifications may be made without departing from the invention in its broader aspects. The claims that follow are therefore intended to cover all such changes and modifications as are permitted by the patent laws of the respective countries in which this patent is granted.

What is claimed is:

1. A method of automatically setting up a digital oscilloscope in response to an input signal comprising the steps of:
   processing the input signal to produce a plurality of live views, each live view presenting a different measurement setup suitable for the input signal;
   displaying as a main waveform view a default one of the live views;
   presenting the remaining live views as alternative waveform views; and
   enabling one of the alternative waveform views to be selected as the main waveform view according to an operator input.

2. The method according to claim 1 wherein the classifying step comprises the steps of:
   defining a set of signal types, each signal type having distinguishable characteristic signal features;
   predetermining the set of measurement setups for the digital oscilloscope that is appropriate to creating a view for each signal type;
   making a plurality of measurements of the input signal to determine distinguishable characteristics; and
   identifying the input signal as the signal type from the set of signal types by comparing the determined distinguishable characteristics from the making step with the distinguishable characteristic signal features.

3. The method as recited in claim 2 wherein the set of signal types includes types selected from the group consisting of regular digital signals, irregular digital signals, sinusoidal signals, television video signals, rectified sinusoidal signals and direct current signals.

4. The method as recited in claim 2 wherein the making step includes making the measurements in both the time and frequency domains.

5. The method according to claim 1 further comprising the step of creating according to the operator input a setup template for the signal type for inclusion in the set of measurement setups of the associating step.

6. The method according to claim 1 wherein the presenting step comprises the step of displaying each of the alternative waveform views in a manner selected from the group consisting of an item in a menu list, a static icon and a miniature live display.

7. The method according to claim 1 further comprising the steps of:
   making measurements of the input signal according to the measurement setup associated with the main waveform view; and
   annotating the main waveform view with the measurements.

8. The method according to claim 1 further comprising the step of designating via the operator input which one of the live views is the default one.

9. The method of operating a digital oscilloscope according to claim 1 further comprising the step of expanding the main waveform view to make it larger and more prominent.

10. The method of operating a digital oscilloscope according to claim 1 further comprising the steps of:
    presenting the live views in two sizes;
    displaying the main waveform view in the larger of the two sizes; and
    displaying the alternative waveform views in the smaller of the two sizes.

* * * * *